US011600751B2

United States Patent
Avramescu et al.

(10) Patent No.: US 11,600,751 B2
(45) Date of Patent: Mar. 7, 2023

(54) LIGHT-EMITTING SEMICONDUCTOR COMPONENT AND METHOD FOR PRODUCING A LIGHT-EMITTING SEMICONDUCTOR COMPONENT

(71) Applicant: Osram Oled GmbH, Regensburg (DE)

(72) Inventors: Adrian Stefan Avramescu, Regensburg (DE); Siegfried Herrmann, Neukirchen (DE); Alexander Behres, Pfatter (DE)

(73) Assignee: OSRAM OLED GMBH, Regensburg (DE)

( * ) Notice: Subject to any disclaimer, the term of this patent is extended or adjusted under 35 U.S.C. 154(b) by 53 days.

(21) Appl. No.: 16/769,586

(22) PCT Filed: Dec. 6, 2018

(86) PCT No.: PCT/EP2018/083789
§ 371 (c)(1),
(2) Date: Jun. 4, 2020

(87) PCT Pub. No.: WO2019/115344
PCT Pub. Date: Jun. 20, 2019

(65) Prior Publication Data
US 2020/0343420 A1 Oct. 29, 2020

(30) Foreign Application Priority Data

Dec. 14, 2017 (DE) .................. 10 2017 129 940.8
May 8, 2018 (DE) .................. 10 2018 111 021.9

(51) Int. Cl.
*H01L 33/50* (2010.01)
*H01L 27/15* (2006.01)

(52) U.S. Cl.
CPC ............ *H01L 33/505* (2013.01); *H01L 27/15* (2013.01); *H01L 33/502* (2013.01); *H01L 33/504* (2013.01)

(58) Field of Classification Search
CPC ..... H01L 27/15; H01L 27/156; H01L 33/504; H01L 33/505; H01L 33/502; H01L 33/50
See application file for complete search history.

(56) References Cited

U.S. PATENT DOCUMENTS

2010/0117997 A1 5/2010 Haase
2010/0264400 A1* 10/2010 Kim ................. H01L 33/08
257/13

(Continued)

FOREIGN PATENT DOCUMENTS

DE 102009037186 A1 2/2011
DE 102012106859 A1 1/2014

(Continued)

OTHER PUBLICATIONS

German search report issued for the corresponding DE application No. 10 2018 111 021.9, dated Mar. 20, 2019, 9 pages (for informational purposes only).

(Continued)

*Primary Examiner* — Lauren R Bell
(74) *Attorney, Agent, or Firm* — Viering, Jentschura & Partner MBB

(57) ABSTRACT

A light-emitting semiconductor component may include a semiconductor body having an active region configured to emit a primary radiation, a first conversion element to convert the primary radiation to a first secondary radiation, a second conversion element to convert the primary radiation to a second secondary radiation, and a mask. The first conversion element and the second conversion element may be arranged at a top side of the semiconductor body, may be configured as bodies that partly cover the semiconductor body, and may be connected to the semiconductor body. The mask may be arranged between the first conversion element, the second conversion element, and the semiconductor body.

(Continued)

The mask may have an opening in the region of each conversion element.

9 Claims, 15 Drawing Sheets

(56) References Cited

U.S. PATENT DOCUMENTS

| | | | |
|---|---|---|---|
| 2012/0193657 A1 | 8/2012 | Von Malm et al. | |
| 2014/0070246 A1 | 3/2014 | Sabathil et al. | |
| 2015/0207043 A1 | 7/2015 | Pfeuffer et al. | |
| 2016/0079489 A1 | 3/2016 | Richter et al. | |
| 2016/0093665 A1* | 3/2016 | Schubert | H01L 33/0062 257/13 |
| 2017/0323925 A1* | 11/2017 | Schneider, Jr. | H01L 27/156 |
| 2017/0358719 A1 | 12/2017 | Scholz et al. | |
| 2017/0365751 A1 | 12/2017 | Butendeich et al. | |
| 2018/0182931 A1* | 6/2018 | Lee | H01L 33/50 |
| 2019/0067529 A1* | 2/2019 | Doan | H01L 27/153 |
| 2019/0103516 A1 | 4/2019 | Moosburger et al. | |
| 2019/0207066 A1 | 7/2019 | Göötz et al. | |

FOREIGN PATENT DOCUMENTS

| | | |
|---|---|---|
| DE | 102013103983 A1 | 11/2014 |
| DE | 102014117892 A1 | 6/2016 |
| DE | 102014117995 A1 | 6/2016 |
| DE | 102016105989 A1 | 10/2017 |
| DE | 102016115533 A1 | 2/2018 |
| EP | 2242120 A1 | 10/2010 |

OTHER PUBLICATIONS

International search report issued for the corresponding PCT application No. PCT/EP2018/083789, dated Mar. 20, 2019, 14 pages (for informational purposes only).

* cited by examiner

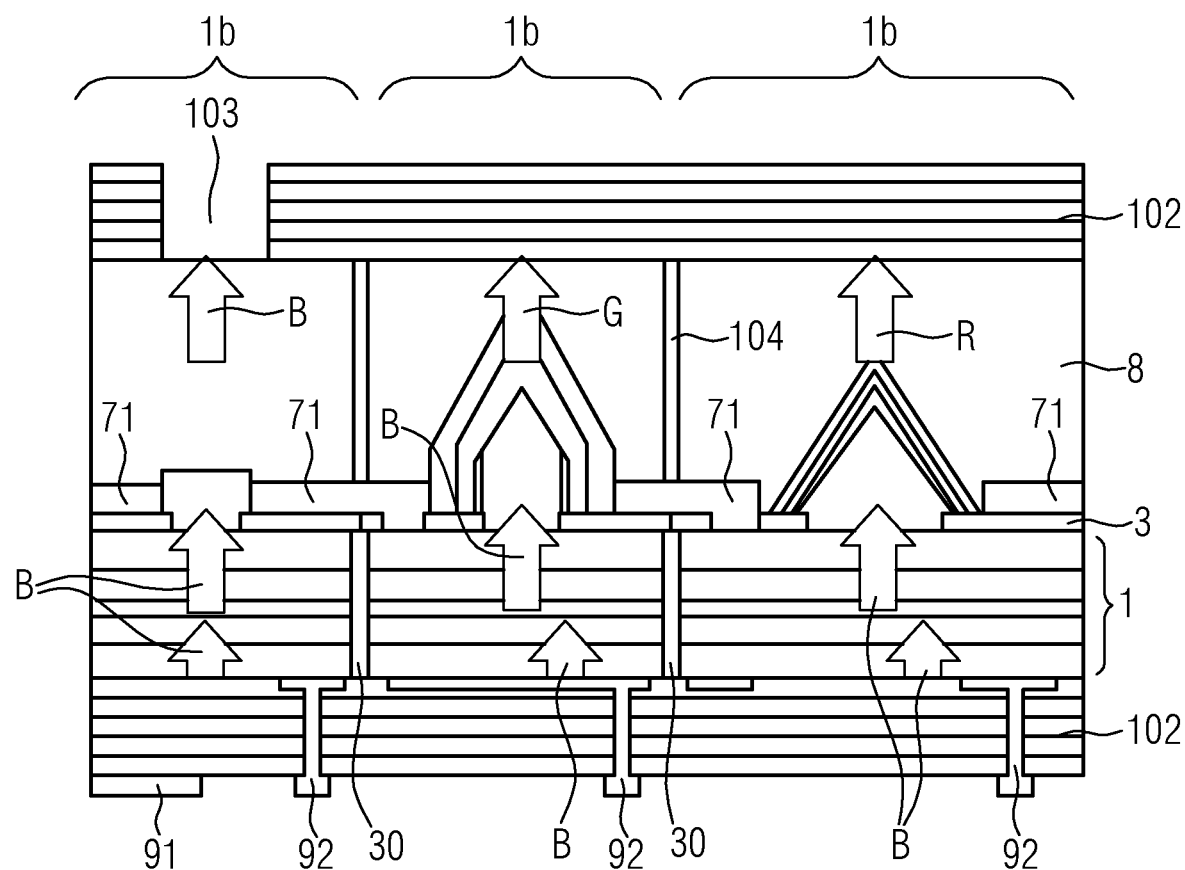

LIGHT-EMITTING SEMICONDUCTOR COMPONENT AND METHOD FOR PRODUCING A LIGHT-EMITTING SEMICONDUCTOR COMPONENT

CROSS-REFERENCE TO RELATED APPLICATIONS

The present application is a national stage entry according to 35 U.S.C. § 371 of PCT application No.: PCT/EP2018/083789 filed on Dec. 6, 2018; which claims priority to German Patent Application Serial No.: 10 2017 129 940.8 filed on Dec. 14, 2017 and German Patent Application Serial No.: 10 2018 111 021.9 filed on May 8, 2018; all of which are incorporated herein by reference in their entirety and for all purposes.

TECHNICAL FIELD

A light-emitting semiconductor component is specified.

BACKGROUND

The document US 2014/0070246 describes a light-emitting semiconductor component.

One object to be achieved is to specify a light-emitting semiconductor component which can be produced particularly precisely and cost-effectively. A further object to be achieved is to specify a method for producing such a light-emitting semiconductor component.

SUMMARY

A light-emitting semiconductor component is specified.

The light-emitting semiconductor component can be for example a light-emitting diode, a light-emitting diode chip, a laser or a laser diode chip.

In accordance with at least one embodiment, the light-emitting semiconductor component comprises a semiconductor body. The semiconductor body is produced epitaxially, for example. The semiconductor body comprises an active region configured for emitting a primary radiation. The primary radiation is for example light from the spectral range from UV radiation to blue light. In particular, the active region is configured for emitting blue light as primary radiation. For this purpose, the active region comprises a quantum well structure or a multiple quantum well structure. The semiconductor body can be based on a nitride compound semiconductor. The active region is then based on InGaN, for example.

In accordance with at least one embodiment of the light-emitting semiconductor component, the semiconductor component comprises a first conversion element configured for converting part of the primary radiation to a secondary radiation. That is to say that the conversion element absorbs for example part of the primary radiation and re-emits a first secondary radiation having a lower energy than the primary radiation. The first secondary radiation is green light, for example. The conversion element is thus provided for being optically pumped by the primary radiation and for emitting secondary radiation.

In accordance with at least one embodiment of the light-emitting semiconductor component, the first conversion element is arranged at a top side of the semiconductor body. By way of example, the first conversion element is formed or applied on a top surface of the semiconductor body, said top surface being formed by a main surface of the semiconductor body.

In accordance with at least one embodiment of the light-emitting semiconductor component, the first conversion element is configured as a body that partly covers the semiconductor body at the top side thereof. That is to say that the first conversion element is a three-dimensional structure, for example a structure configured in pyramidal or cylindrical or parallelepipedal fashion. In this case, the first conversion element does not completely cover the semiconductor body at the top side thereof, but rather only partly. By way of example, the first conversion element covers a small part of the top surface at the top side of the semiconductor body. By way of example, at most 30%, in particular at most 10%, of the top surface is covered by the first conversion element.

In accordance with at least one embodiment, the light-emitting semiconductor component comprises a semiconductor body having an active region configured for emitting a primary radiation, and a first conversion element configured for converting part of the primary radiation to a first secondary radiation. In this case, the first conversion element is arranged at a top side of the semiconductor body, the first conversion element is configured as a body that partly covers the semiconductor body at the top side thereof, and the first conversion element is connected to the semiconductor body.

In accordance with at least one embodiment of the light-emitting semiconductor component, the light-emitting semiconductor component comprises a second conversion element configured for converting part of the primary radiation to a second secondary radiation. The second conversion element can be formed for example with a different material than the first conversion element. In this regard, the first conversion element can be based on a nitride compound semiconductor material, for example, whereas the second conversion element can be based on a nitride, phosphide or arsenide compound semiconductor material. For example, the first and second conversion elements can each be based on InGaN, the second conversion element having a higher indium concentration at least in places. In order to generate red light, the indium concentration in the second conversion element can be for example 40% or more.

The second conversion element is arranged at the top side of the semiconductor body, and the second conversion element is configured as a body that partly covers the semiconductor body at the top side thereof. In this case, the second conversion element is connected to the semiconductor body. The second secondary radiation emitted by the second conversion element can comprise in particular light in a different wavelength range than the first secondary radiation. By way of example, the first secondary radiation can be green light and the second secondary radiation can be red light.

Furthermore, it is possible for the semiconductor component to comprise further conversion elements, for example a plurality of first conversion elements and a plurality of second conversion elements or conversion elements of a different type, which emit secondary radiation of a different type, for example amber-colored light.

In accordance with at least one embodiment of the light-emitting semiconductor component, at least one of the conversion elements, for example the first conversion element and/or the second conversion element, is monolithically connected to the semiconductor body. That is to say that the at least one conversion element and the semiconductor body can directly adjoin one another. Between the at least one conversion element and the semiconductor body, for example, there is arranged no further material which belongs neither to the semiconductor body nor to the conversion element and which promotes adhesion between the conversion element and the semiconductor body. Rather, the at least one conversion element is secured to the semiconductor body directly and in direct contact with the semiconductor body.

Furthermore, a method for producing a light-emitting semiconductor component is specified. In particular, a light-emitting semiconductor component described here is producible by the method, such that all features disclosed for the light-emitting semiconductor component are also disclosed for the method, and vice versa.

In accordance with at least one embodiment of the method, firstly the semiconductor body is provided. In this case, the semiconductor body can be present in the wafer assemblage, for example, wherein the wafer assemblage comprises a multiplicity of the semiconductor bodies, which are jointly grown epitaxially, for example.

In a next method step, a mask having a multiplicity of openings is produced at the top side of the semiconductor body. The mask can be formed for example with an electrically insulating material, for example with a photoresist material and/or with a silicon oxide and/or with a silicon nitride. The openings can then be produced lithographically in a particularly precise manner, in particular by means of a photographic technique.

This is followed by epitaxially producing a multiplicity of first and/or second conversion elements and/or further conversion elements at the top side of the semiconductor body in the openings of the mask. That is to say that the conversion elements are produced by selective growth in the openings directly on the semiconductor body.

A light-emitting semiconductor component described here and a method described here are based in this case on the following considerations, in particular. Light-emitting diodes which can generate red, green and blue light, for example, so-called RGB LEDs, have fine structures which make it possible for example to use the light-emitting diodes as imaging elements in a display device (display). If the different colors of the light generated by the light-emitting diode are intended to be generated by conversion, then very small structures have to be covered locally with conversion material. The accurate positioning of conversion elements poses a great technological challenge in this case. To that end, it is possible to use methods such as pick-and-place methods, spraying or dispensing, for example, which can be used only with great technical outlay, however, for small distances between the different conversion elements. Alternatively, it is possible to form the individual emission regions of such a light-emitting diode with different light-emitting diode chips which are provided for emitting blue, green and red light and are based for example on nitride compound semiconductor material and phosphide compound semiconductor material.

A light-emitting semiconductor component described here and a method described here are based on the concept of producing local conversion structures, the conversion elements, on a semiconductor body. That is done by producing conversion elements that are deposited in a locally structured manner by means of selective epitaxy on a semiconductor body comprising an active region that emits blue light, for example. That is to say that the conversion elements of the light-emitting semiconductor component are spatially separated from one another and are connected to one another only by another component part of the semiconductor component, for example by the semiconductor body. The openings in the mask can be produced photolithographically, such that the conversion elements produced by means of selective epitaxy are aligned with one another and positioned on the semiconductor body with photolithographic accuracy.

The epitaxially deposited conversion elements produced in this way convert the light from the planar basic layer of the semiconductor body, for example at the top side of the semiconductor body, into light having a different wavelength, that is to say into the secondary radiation. In this case, the conversion elements can be situated at the emission side and also at the side opposite the emission side of the light-emitting semiconductor component. The emission wavelengths of the conversion elements can be influenced by the construction of their active regions, for example by the construction of their quantum well structures. In this case, by way of example, the material composition, for example the indium content, and/or the thickness can be adapted. Furthermore, the emission wavelength of the conversion elements can be influenced by lattice strains and the so-called Quantum Confined Stark Effect. Furthermore, a possibility arises for influencing the emission wavelength by means of the selection of the crystal planes that outwardly bound the conversion elements.

A light-emitting semiconductor component described here and a method described here are distinguished in this case by the following advantages, inter alia: a highly accurate positionability of the light-converting microstructures, that is to say of the conversion elements, with respect to the light-emitting regions of the semiconductor body is possible. The conversion elements can be encapsulated directly in the epitaxy process, with the result that they are protected particularly well against external mechanical and chemical influences. There is the possibility of producing an RGB LED made from purely inorganic material. A particularly fine pixelation is possible since the distances between the conversion elements can be chosen to be very small with respect to one another. For example, the semiconductor components can have a maximum lateral extent of at most 10 μm. The conversion elements as bodies at the top side of the semiconductor body can improve the coupling-out properties by virtue of, for example, the reduction of the probability of total internal reflection when light emerges.

Light-emitting semiconductor components described here can be surface-mountable for example as an SMT design. They can be used in video walls, in industrial image reproduction, for example in the medical field, in so-called data displays. They can be used as so-called HUD or HMD displays in the motor vehicle sector, in the defense sector or in aircraft.

The following embodiments relate both to light-emitting semiconductor components described here and to methods described here for producing light-emitting semiconductor components.

In accordance with at least one embodiment, the first conversion element and/or the second conversion element are/is configured as a microrod or as a nanorod. The conversion elements can then be so-called core-shell rods, for example, which comprise doped regions between which is arranged an active region comprising for example a quantum well structure or a multiple quantum well structure.

In accordance with at least one embodiment, the first conversion element and/or the second conversion element are/is produced epitaxially at the top side of the semiconductor body. This is not just a method feature, but likewise a substantive feature which can be demonstrated on the finished component. In particular, in this case, no connecting material, such as an adhesive, for example, is arranged between the conversion elements and the semiconductor body, rather the two component parts of the semiconductor component directly adjoin one another.

In accordance with at least one embodiment, the first conversion element and/or the second conversion element have/has a maximum lateral extent that is small relative to the maximum lateral extent of the semiconductor body. By way of example, the lateral extent is measured in each case in a plane running parallel to the main plane of extent of the semiconductor body. In other words, the conversion elements are small relative to the semiconductor body and cover the latter only locally. The conversion elements are not in direct contact with one another, but rather are only indirectly connected to one another. By way of example, the conversion elements are connected to one another by the semiconductor body.

The first conversion element and/or the second conversion element have/has for example a minimum lateral extent which is at least 10 nm, in particular at least 50 nm, and at most 50 µm, in particular at most 25 µm. The vertical extent of the conversion element can be from at least 100 nm to a few µm.

In accordance with at least one embodiment, a mask is arranged between the first conversion element and the second conversion element and also the semiconductor body, said mask having an opening in the region of each conversion element. In the region of the opening, the conversion element is produced on the semiconductor body. In this case, the conversion element can project beyond the opening in a lateral direction and, in this way, material of the mask can also be arranged between the conversion element and the semiconductor body.

In accordance with at least one embodiment, the semiconductor body is structured into a plurality of regions which are operable independently of one another, wherein one of the conversion elements is assigned to at least one of the regions. By way of example, the semiconductor body can be structured into a number of regions that is a multiple of 3. In this case, respectively one region is provided for emitting blue light, one region is provided for emitting green light and one region is provided for emitting red light. By way of example, in the region of the semiconductor body which is provided for emitting blue light, no conversion element is assigned to this region. A first conversion element and a second conversion element can be assigned to the other regions.

The light-emitting semiconductor component can thus be configured in particular for emitting blue, green and red light, wherein it is possible that light of different colors can be emitted independently of one another.

In accordance with at least one embodiment of the light-emitting semiconductor component, the light-emitting semiconductor component comprises a dielectric mirror at the top side or at an underside of the semiconductor body, said underside facing away from the top side, wherein the dielectric mirror is provided for reflecting the primary radiation and is transmissive to the first secondary radiation and the second secondary radiation, and the dielectric mirror has at least one opening configured for transmitting the primary radiation. Such a dielectric mirror, which can be a DBR mirror, for example, makes it possible for red, green and blue light to be emitted selectively from the emission surface of the component.

In accordance with at least one embodiment of the light-emitting semiconductor component, a matrix material is arranged between the conversion elements and the semiconductor body. The conversion elements are for example at least one of the following conversion elements: first conversion element, second conversion element, further conversion element. The matrix material is a radiation-transmissive material which is transmissive, in particular transparent, to the primary radiation or at least one of the secondary radiations. For example, the matrix material can contain one of the following materials or consist of one of the following materials: silicone, epoxy, PMMA, COC.

The matrix material is arranged indirectly or directly between the semiconductor body and the conversion elements. By way of example, the matrix material directly adjoins the semiconductor body. Furthermore, it is possible for a further component part of the light-emitting semiconductor component to be arranged between the matrix material and the semiconductor body, said further component part being connected to the semiconductor body. By way of example, the further component part can be a carrier or a growth substrate for the semiconductor body.

The matrix material can serve in particular for securing the conversion elements to the semiconductor body indirectly or directly. By way of example, the matrix material has adhesion-promoting, in particular adhesive, properties for this purpose.

The conversion elements may be embedded into the matrix material. That is to say that the conversion elements can directly adjoin the matrix material and be surrounded by the latter at least at part of their outer surface. By way of example, a multiplicity of the conversion elements are embedded into the matrix material.

In accordance with at least one embodiment of the light-emitting semiconductor component, at least one of the conversion elements tapers in the direction toward the semiconductor body. The at least one of the conversion elements is for example at least one of the following conversion elements: first conversion element, second conversion element, further conversion element. The at least one conversion element has a tip, for example, in the direction of which the conversion element tapers. That is to say that the cross section of the conversion element becomes smaller in the direction of the tip. The at least one conversion element can then be secured to the semiconductor body in such a way that the conversion element tapers in the direction toward the semiconductor body. In this way, the area through which primary radiation enters the conversion element can be enlarged. This increases the efficiency of the conversion element.

In accordance with at least one embodiment of the light-emitting semiconductor component, at least one of the conversion elements is secured to the semiconductor body. The at least one of the conversion elements is, in particular, one of the following conversion elements: first conversion element, second conversion element, further conversion element. The at least one conversion element is secured to the semiconductor body. That is to say that, in this embodiment, the conversion element is not monolithically connected to the semiconductor body, rather for example an adhesion-promoting, in particular an adhesive, material is arranged between the conversion element and the semiconductor body and mechanically connects the conversion element to the semiconductor body. In this case, the conversion element is produced independently of the semiconductor body and is applied thereto by means of a transfer process. As a result, in comparison with a monolithic connection of the at least one conversion element to the semiconductor body, it is possible to make the production of the conversion element more variable. That is to say that with regard to the material selection, the shape and the size of the at least one conversion element, for example, the number of degrees of freedom that arise is more than is possible when the conversion element is grown directly on the semiconductor body.

A light-emitting semiconductor component described here is based in this case on the following considerations, inter alia: for example, ceramic conversion elements present in powder form can be embedded into a matrix material and sprayed onto a semiconductor body. In the case of this configuration, the problem arises that the heat generated by the conversion element, said heat arising on account of the Stokes shift and the finite quantum efficiency of the conversion during operation, is dissipated poorly owing to the thermal properties and the geometry, for example the thickness of the matrix material. The light-emitting semiconductor component heats up during operation as a result.

This heating has various negative effects: the matrix material can turn yellow, the temperature of the semiconductor body rises during operation of the active region, and the efficiency of the conversion element decreases. The consequence thereof is that the color quality, the efficiency and the lifetime of the semiconductor component decrease. The color quality of the mixed light emitted by the semiconductor component during operation is intended to remain constant during operation, however, which is difficult to realize owing to the impairments explained.

It has furthermore been established that the spatial extent of the beam of rays emitted by the semiconductor component during operation is greatly dependent on the layer thickness and thus the scattering volume of the conversion element in the matrix material. However, for good optical imaging, for example in display devices, a high contrast ratio between the pixels, that is to say for example adjacent light-emitting semiconductor components, is desirable.

Furthermore, for conversion elements in powder form which are introduced into a matrix material, problems arise in the case of shaping over spatial structures and in the case of spatially exact positioning on small semiconductor bodies. This is the case in particular on account of fluctuations of the density of the pulverulent conversion elements in the matrix material. In the case of the light-emitting semiconductor component described here, this problem can be solved since the conversion elements are configured as bodies that can be produced and arranged at regular distances from one another, for example. These bodies spaced at regular distances can then be connected to the semiconductor body in an ordered way.

The conversion elements are formed by unipolar microrod or nanorod structures, for example. These structures can be produced directly on the semiconductor body or can be secured to the semiconductor body after having been embedded into a thin layer of the matrix material. In this case, the matrix material has for example a thickness of at most 1 μm.

Furthermore, a further method for producing a light-emitting semiconductor component is specified. In particular, light-emitting semiconductor components described here can be produced by the method. That is to say that all features described for the semiconductor components are also disclosed for the method, and vice versa.

In accordance with at least one embodiment of the method, firstly a growth substrate is provided. The growth substrate can be formed with sapphire, for example.

In accordance with at least one embodiment of the method, a mask as described above having a multiplicity of openings is produced at the top side of the growth substrate. In this case, the mask can be applied directly on the growth substrate. Furthermore, it is possible for at least one epitaxially grown semiconductor layer to be arranged between the growth substrate and the mask. The openings in the mask can be arranged regularly, for example. The openings in the mask are then arranged at the nodes of a regular, two-dimensional lattice. Alternatively, it is possible for the openings in the mask to be arranged randomly. A random arrangement of the openings arises for example from a shadow mask technique using polystyrene beads. In this case, the beads are distributed randomly in a liquid medium on account of surface tension effects and are subsequently transferred as a mask to the passivation of a growth substrate, for example.

In accordance with at least one embodiment of the method, a multiplicity of conversion elements are produced epitaxially at the top side of the growth substrate in the openings of the mask. The multiplicity of conversion elements comprises for example at least one of the following conversion elements: first conversion element, second conversion element, further conversion element.

In accordance with at least one embodiment of the method, at least one portion of the conversion elements, for example also all of the conversion elements, is encapsulated with a matrix material. That is to say that the conversion elements are embedded into a matrix material described here. In this case, the thickness of the matrix material is chosen such that it covers the conversion elements at their side facing away from the growth substrate. That is to say that the thickness of the matrix material is greater than or equal to the height of the conversion elements above the mask. By way of example, the matrix material then has a thickness of at most 2 μm, in particular of at most 1 μm.

In accordance with at least one embodiment of the method, the matrix material with the encapsulated conversion elements is detached from the growth substrate. That is to say that the matrix material serves to detach the encapsulated conversion elements from the growth substrate. The conversion elements are removed from the growth substrate for example by mechanical force action on the matrix material. For this purpose, the matrix material can be at least partly cured after encapsulating the conversion elements.

In accordance with at least one embodiment of the method, the matrix material is applied to a semiconductor body comprising an active region configured for emitting a primary radiation. This can be done before or after encapsulating and detaching the conversion elements. In this case, by way of example, the matrix material can serve as an adhesion promoter between the semiconductor body and the conversion elements. Alternatively, it is possible for at least one further component part to be arranged between the semiconductor body and the matrix material with the detached conversion elements. The further component part can be for example a growth substrate, a carrier and/or a connecting medium such as an adhesive, for example.

The transfer of the matrix material with the encapsulated conversion elements can be carried out in various ways in the case of this method. For example, a direct transfer from the growth substrate to the semiconductor body can be carried out. To that end, the matrix material can be applied in a thin layer on the semiconductor body. The conversion elements still secured to the growth substrate can then be brought into contact with said layer. For example, the conversion elements are pressed into the layer of matrix material. After the curing of the layer, the growth substrate can be removed and the conversion elements remain in the layer.

Alternatively, it is possible for the matrix material to be applied on the growth substrate, for the encapsulated conversion elements with the matrix material to be detached from the growth substrate, and then for the detached matrix material with the encapsulated conversion elements to be secured to the semiconductor body.

Finally, it is possible for the matrix material to be applied on a transfer substrate, for the conversion elements to be transferred to the transfer substrate and, from there, for a transfer to the semiconductor body to be carried out. This method has the advantage that the layer of the matrix material can be structured and, in this way, structured and thus also partial detachment of the conversion elements can be carried out.

In the method, conversion elements of different types can be present on a single growth substrate and can be transferred from the latter to the semiconductor body. Furthermore, it is possible for only conversion elements of one type to be present on the growth substrate and to be transferred to the semiconductor body. In this case, conversion elements of different types which are present on different growth substrates can then also be transferred to one and the same semiconductor body.

In accordance with at least one embodiment, the method comprises the following steps, which are carried out in the order indicated or in some other order:
  providing a growth substrate,
  producing a mask having a multiplicity of openings at the top side of the growth substrate,
  epitaxially producing a multiplicity of conversion elements at the top side of the growth substrate in the openings of the mask,
  encapsulating at least one portion of the conversion elements with a matrix material,
  detaching the matrix material from the growth substrate,
  applying the matrix material to a semiconductor body comprising an active region configured for emitting a primary radiation (B).

In accordance with at least one embodiment of the method, the mask is detached together with the matrix material and is applied to the semiconductor body together with the matrix material. In this embodiment, the mask remains in the finished component. It can face or face away from the semiconductor body. Furthermore, the opening in which respectively one of the conversion elements is produced remains in the completed semiconductor component. In this case, the mask can mechanically stabilize the composite assembly comprising matrix material and conversion elements during transfer and after transfer. The transfer of the conversion elements to the semiconductor body can be facilitated in this way.

In accordance with at least one embodiment of the method, the matrix material mediates a mechanical connection of the conversion elements to the semiconductor body. This can be achieved for example by virtue of the matrix material facing the semiconductor body after transfer. In this case, it is possible, in particular, for the conversion elements to taper in the direction of the semiconductor body, as described above. By way of example, the matrix material is not completely cured before transfer or is applied on the semiconductor body before transfer. In this way, the matrix material itself serves as an adhesive medium for securing the conversion elements to the semiconductor body.

In accordance with at least one embodiment of the method, particles are introduced into the matrix material, wherein the particles are provided for scattering and/or for converting the primary radiation and/or a secondary radiation. In this case, by way of example, the particles can be introduced before the matrix material is applied on the semiconductor body. The particles are for example light-scattering particles formed with materials such as $SiO_2$ or $TiO_2$. Furthermore, it is possible for the particles to be particles of a phosphor. The phosphor can then be for example a ceramic phosphor or a quantum dot phosphor (so-called quantum dot converter). In this way, the conversion elements described here can be combined with more conventional conversion elements. For the case where particles are introduced into the matrix material, it is also possible, in particular, for the thickness of the matrix material to be chosen to be greater than 1 µm. By way of example, the thickness of the matrix material in a direction perpendicular to the main plane of extent of the semiconductor component can then be 2 µm or more.

A light-emitting semiconductor component described here and a method described here are distinguished in this case by the following advantages, inter alia:

On account of the small thickness of the matrix material, it is possible for the heat generated during operation to be dissipated particularly efficiently. The use of the conversion elements described here additionally improves the thermal properties since during operation less heat is generated than is the case for conventional, for example ceramic, phosphors.

Under the for example blue primary radiation and the lower operating temperature, the matrix material turns yellow to a lesser extent than in the case of conventional semiconductor components since the matrix material can be chosen to be particularly thin.

The temperature of the semiconductor body rises to a lesser extent in the active region and the efficiency of the conversion elements is temperature-dependent to a lesser extent. The consequence thereof is that the color quality, the efficiency and the lifetime of the semiconductor component improve.

Furthermore, the light emitted by the semiconductor component has a smaller extent of the beam of rays, which is made possible by the small layer thickness of the matrix material and thus the reduced scattering volume. This allows good imaging, for example when the semiconductor component is used in a display device—for instance in a microdisplay. Furthermore, a particularly high contrast ratio is made possible as a result.

Furthermore, the method described here makes possible spatially particularly accurate positioning of local conversion regions in an exactly uniform manner and density concentration on semiconductor bodies.

The light-emitting semiconductor component described here and the method described here are explained in greater detail below on the basis of exemplary embodiments and with reference to the associated figures.

BRIEF DESCRIPTION OF THE FIGURES

In the following, the light emitting semiconductor devices described herein are explained in more detail in conjunction with non-limiting embodiments and the associated figures.

In association with FIGS. 1A, 1B, 1C, 1D, 1E, 1F, 1G, 1H, 1I, 1J, 1K, 1L, exemplary embodiments of a method described here are explained in greater detail with reference to schematic sectional illustrations.

With reference to the schematic sectional illustrations in FIGS. 2, 3, 4, 5, 6, 7A, 7B, 8A, 8B, exemplary embodiments of light-emitting semiconductor components described here and of methods described here are explained in greater detail.

The schematic illustrations in FIGS. 9A, 9B, 9C, 9D, 9E, 9F show a further exemplary embodiment of a method described here for producing a light-emitting semiconductor component.

The schematic illustrations in FIGS. 10, 11, 12, 13 show further exemplary embodiments of light-emitting semiconductor components described here.

Figure 14:
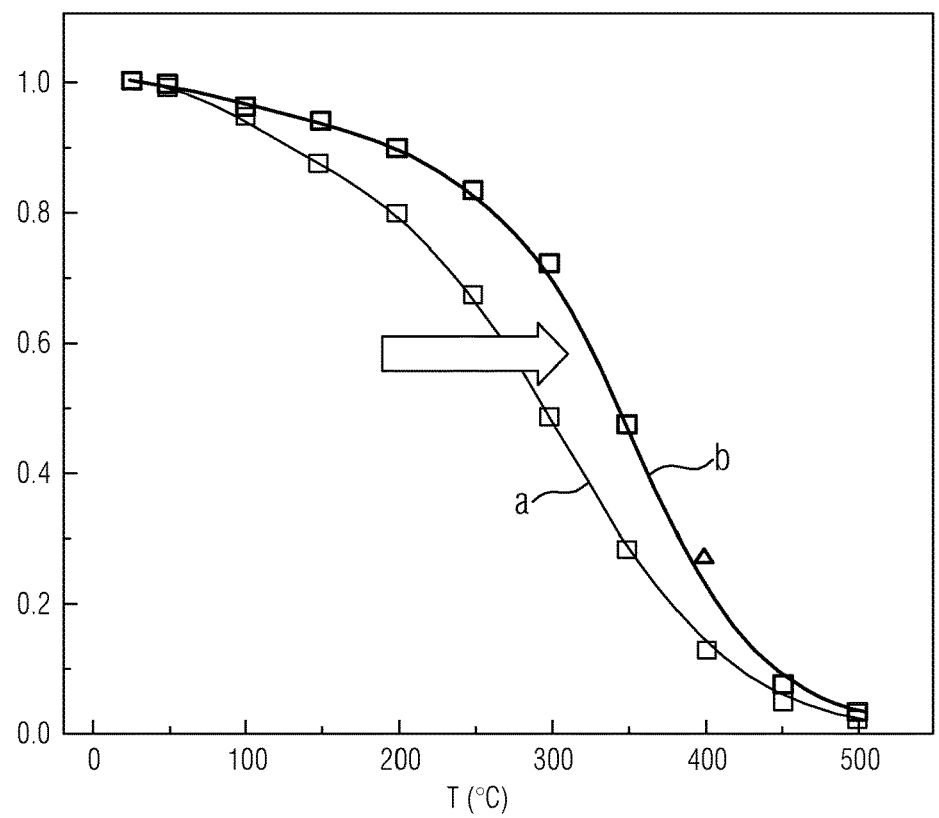
Figure 15:
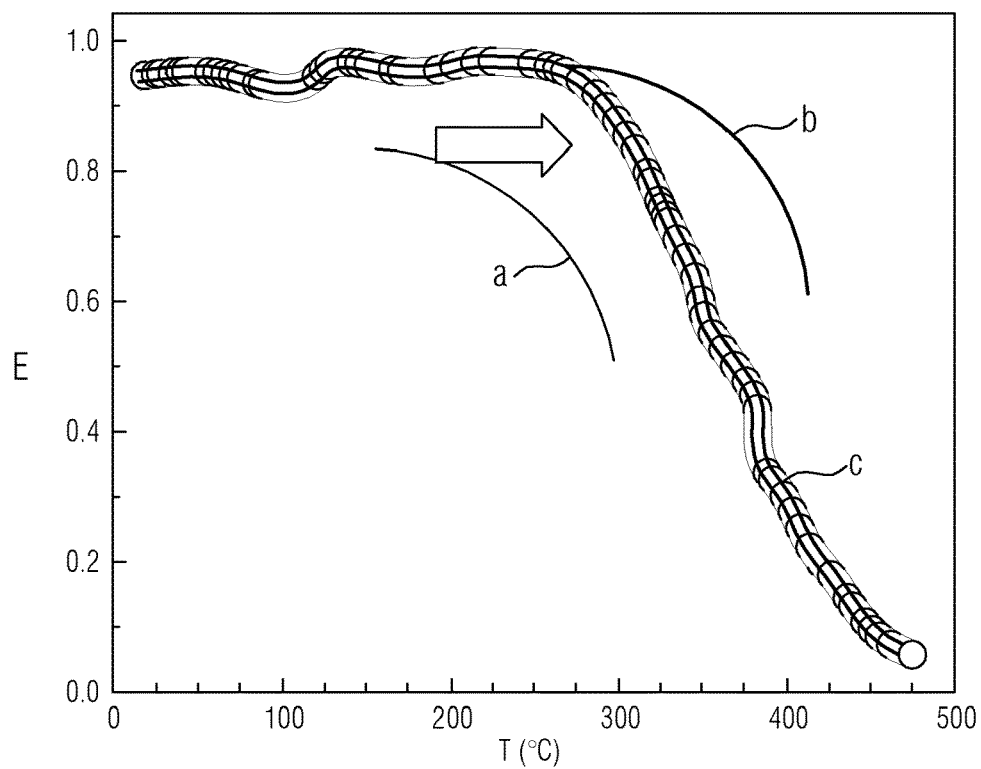

With reference to the graphical illustrations in FIGS. 14 and 15, advantages of light-emitting semiconductor components described here are explained in greater detail.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or to afford a better understanding.

DESCRIPTION

In association with FIGS. 1A to 1L, exemplary embodiments of a method described here are explained in greater detail with reference to schematic sectional illustrations. In the method, firstly a semiconductor body 1 is provided, which can be present in a wafer assemblage, for example. The semiconductor body 1 comprises a first doped region 11, which can be n-doped, for example, a second doped region 12, which can be p-doped, for example, and an active region 13 arranged between the two doped regions 11, 12. The semiconductor body is based on a nitride compound semiconductor material, for example. The doped regions are based on GaN, for example, and the active region 13 is based on InGaN/GaN multiple quantum well structures, for example.

The semiconductor body comprises a top side 1a and an underside 1c facing away from the top side. The semiconductor body 1 is applied on a growth substrate 2, for example, which can be formed with sapphire, for example.

Figure 1A:
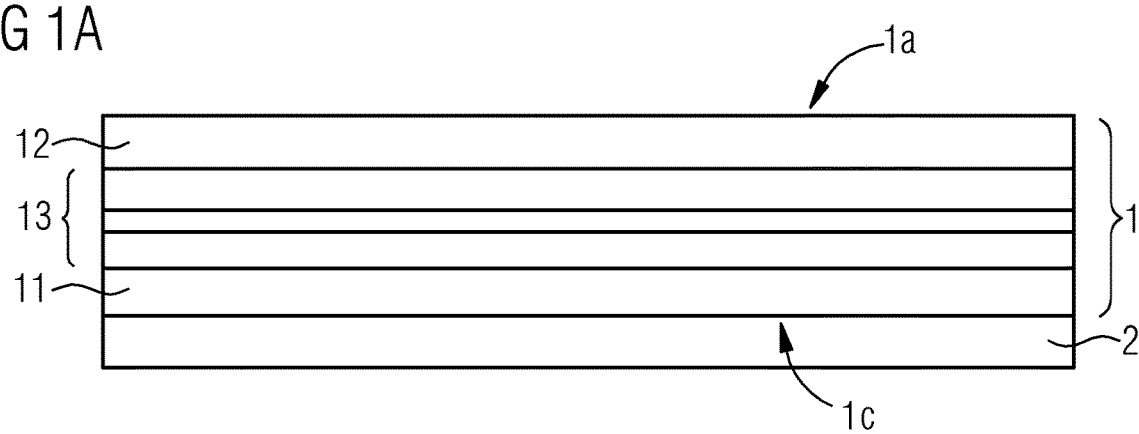
Figure 1B:
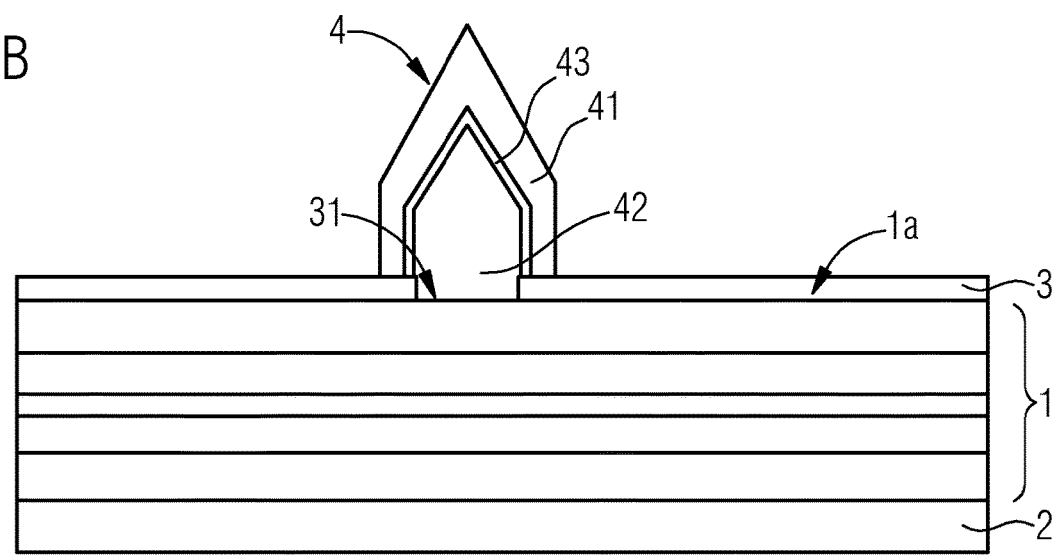

In a next method step, FIG. 1B, a mask 3, which for example is configured as electrically insulating and has a first opening 31, is produced at the top side 1a of the semiconductor body 1. The first opening 31 is produced lithographically, for example. A selective epitaxy step is carried out, by means of which a first conversion element 4 is produced in the region of the first opening 31 of the mask 3. In the present case, the first conversion element 4 is a core-shell rod, for example. The first conversion element 4 comprises a first doped region 41, a second doped region 42 and an active region 43, which can comprise a quantum well structure or a multiple quantum well structure. By way of example, the first conversion element 4 is based on InGaN.

Figure 1C:
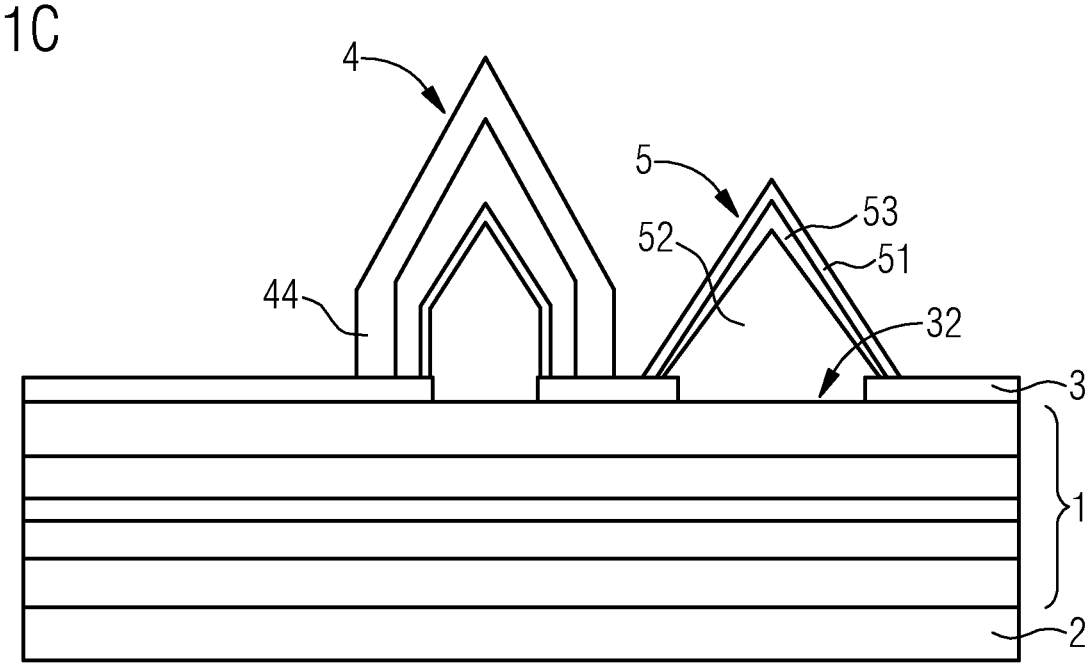

In a subsequent method step, FIG. 1C, a second opening 32 is produced in the mask 3, in which a second conversion element 5 having a first doped region 51, a second doped region 52 and an active region 53 is applied by means of selective epitaxy. By way of example, the second conversion element is based on a nitride or a phosphide compound semiconductor material. Furthermore, the first conversion element can be covered by a passivation 44, which is formed with $SiO_2$, for example. The passivation 44 then serves for example to enable the selective growth of the second conversion element in the second opening 32.

Figure 1D:
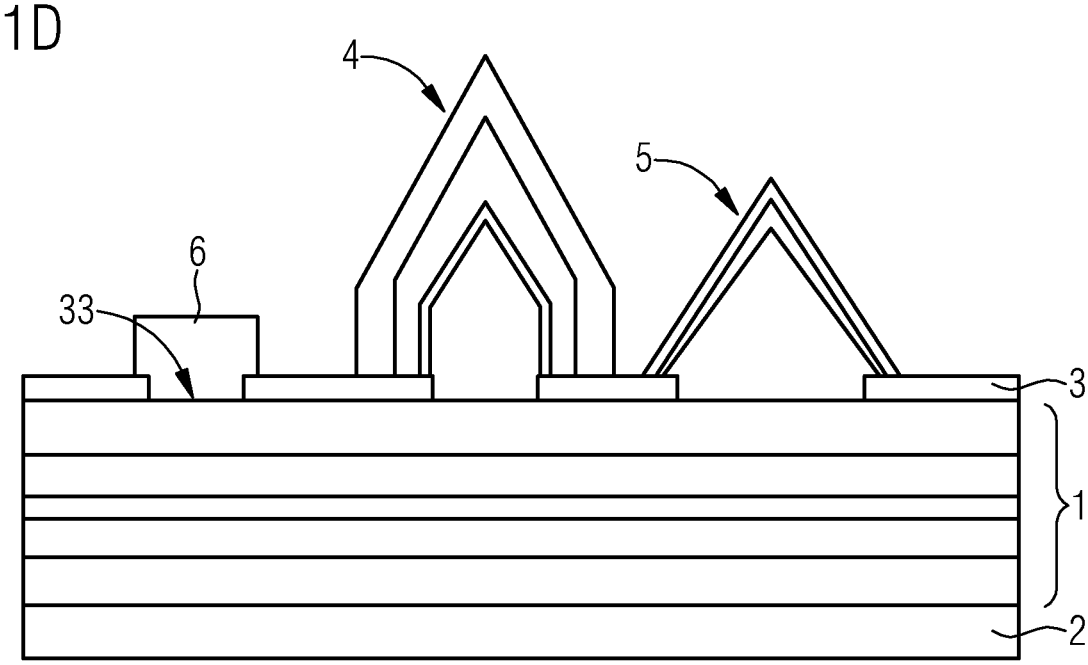
Figure 1E:
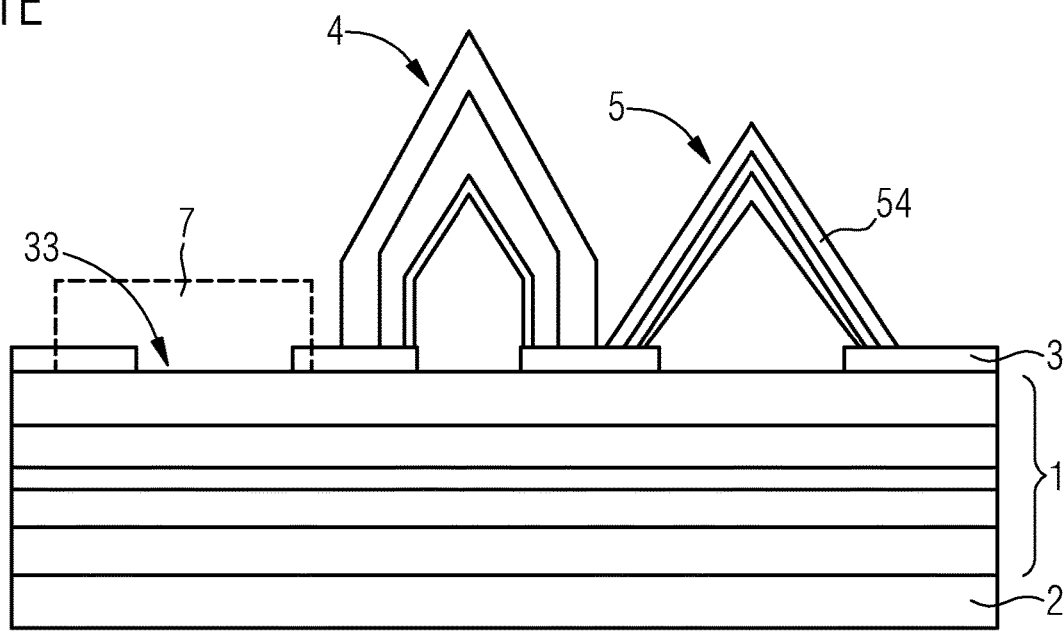

In the next method step, FIG. 1D, a third opening 33 is produced in the mask 3, which can be covered by a light-transmissive passivation 6, for example. Alternatively, it is possible for the third opening 33 to be covered by a contact element 7, which for example is formed with a TCO material and is provided for the p-side connection. The second conversion element 5 can be covered with a light-transmissive passivation 54, FIG. 1E. The passivation 6 and the passivation 54 are formed with $SiO_2$, for example.

Figure 1F:
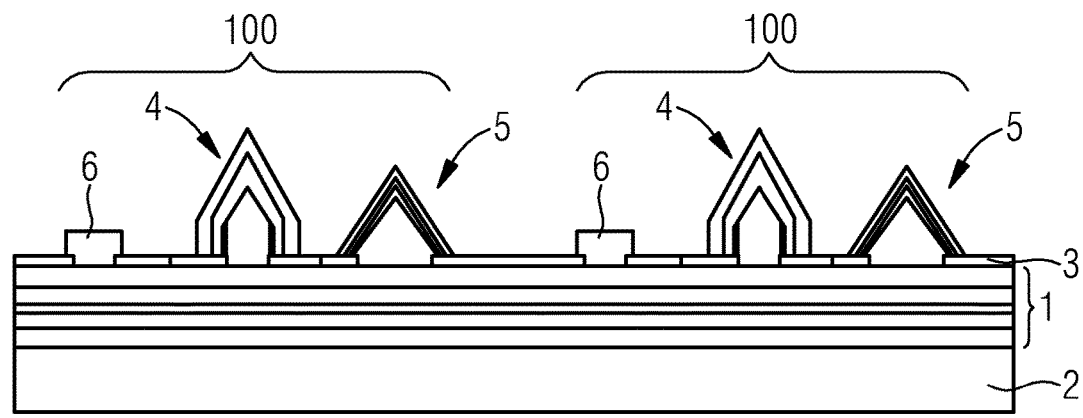

The schematic sectional illustration in FIG. 1F shows a semiconductor body 1 in a wafer assemblage, which comprises a plurality of RGB units or pixels 100. By way of example, an emission of green light can be provided from the first conversion element 4, then an emission of red light is provided from the second conversion element 5 and blue light can be emitted in the region of the passivation 6.

Figure 1G:
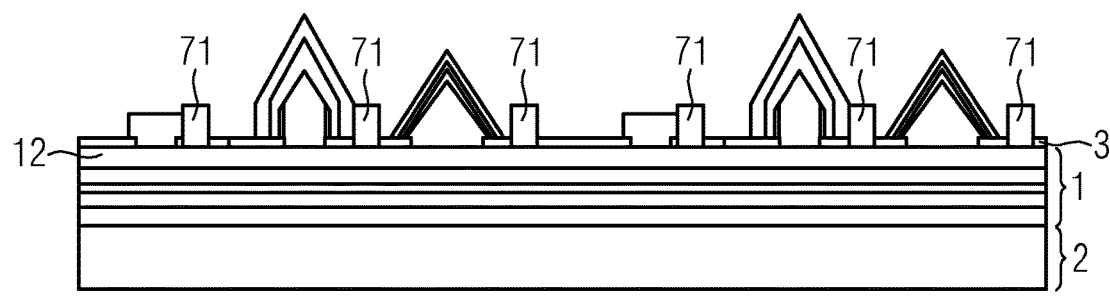

In the next method step, FIG. 1G, contact elements 71 for p-side contacting can be produced, which penetrate through the mask 3 and are in electrically conductive contact with the second doped region 12.

Figure 1H:
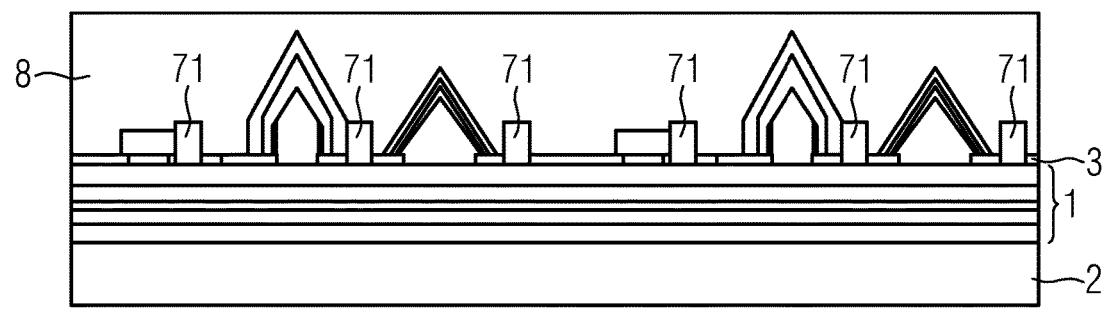

Afterward, FIG. 1H, a planarization 8 is applied to the top side 1a of the semiconductor body 1, said planarization completely covering the conversion elements 4, 5. The planarization 8 can be formed with a light-transmissive plastics material or silicone.

Figure 1I:
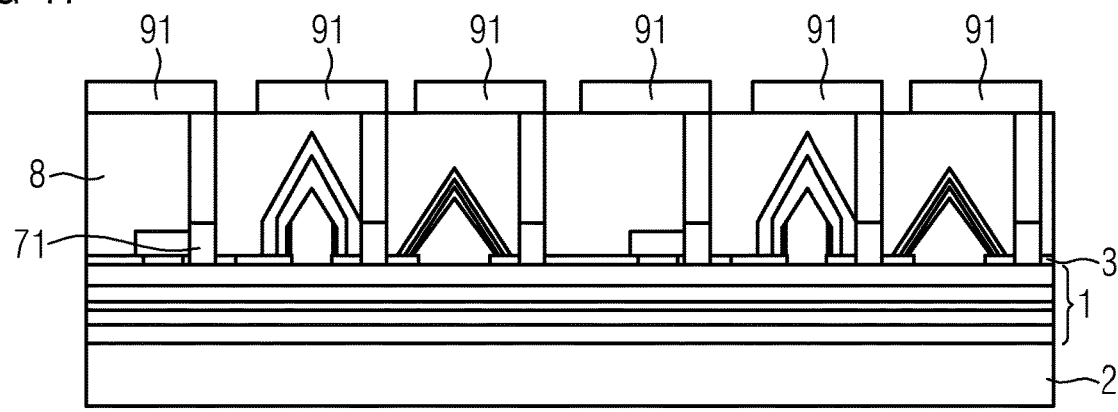

In the next method step, FIG. 1I, it is optionally possible for connection elements 91 for p-side contacting to be connected to the contact elements 71 through the planarization 8, for example by the formation of plated-through holes.

Figure 1J:
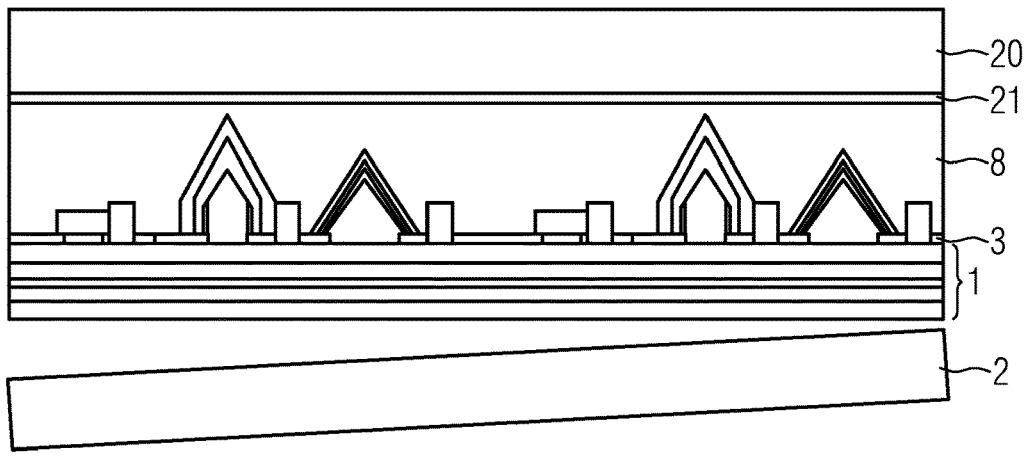

In the subsequent method step, FIG. 1J, a carrier 20 is connected to the planarization layer 8 by way of a connecting layer 21. The carrier 20 can be for example a temporary carrier attached by adhesive bonding. The growth substrate 2 can be detached.

Figure 1K:
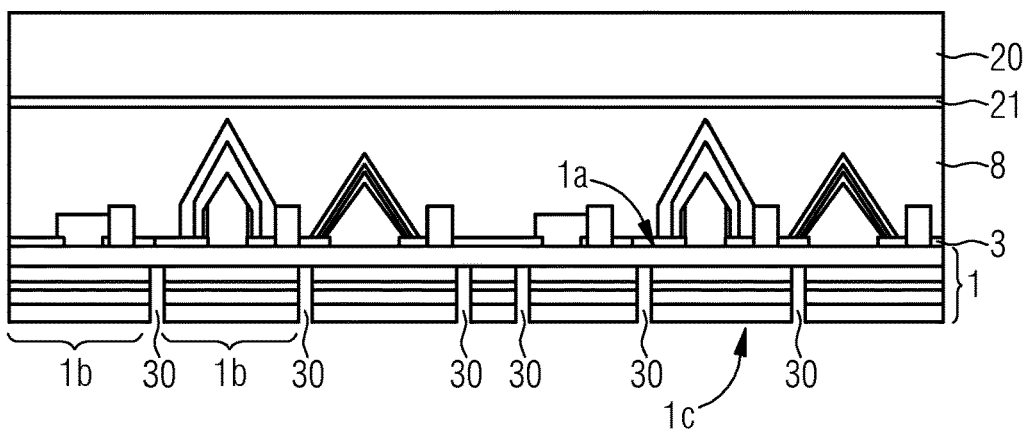

In the next method step, FIG. 1K, the semiconductor body 1 is structured into regions 1b by means of trenches 30, which can extend partly or completely through the semiconductor body 1 from the underside 1c in the direction of the top side 1a.

Figure 1L:
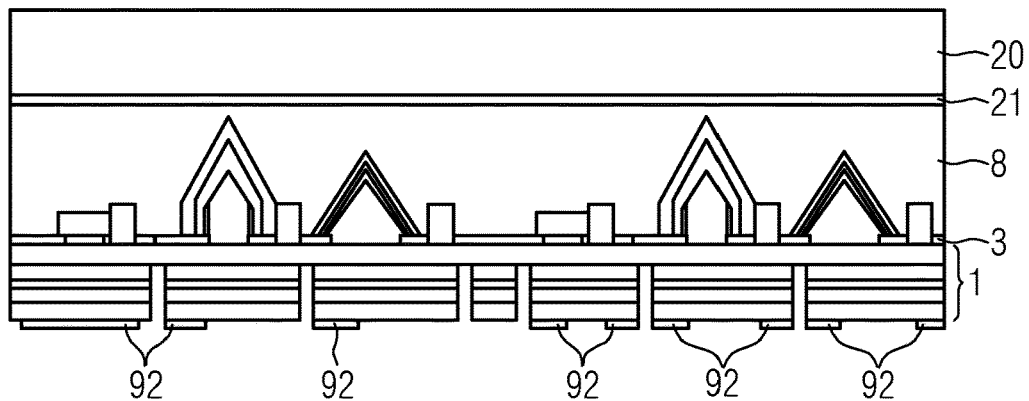

In the next method step, FIG. 1L, connection elements 92 provided for n-side contacting, for example, can be applied. The connection elements 92 can be applied for example in a manner structured pixel by pixel centrally, in a manner positioned laterally with a hole for coupling out light or over the whole area if the p-conducting contact is structured pixel by pixel.

In the region of the trenches 30, at least the active region 30 can be passivated at its side surfaces.

Figure 2:
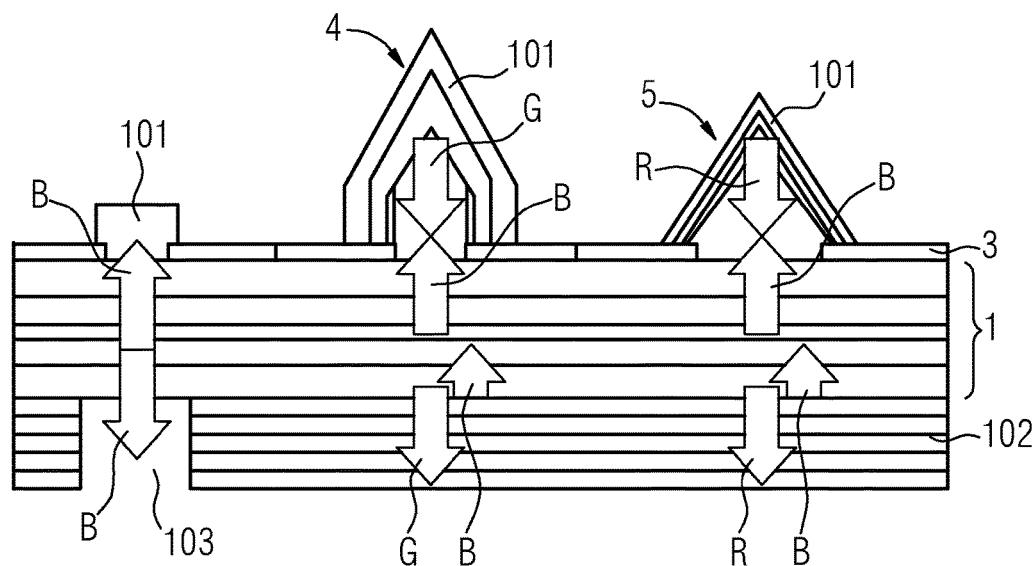

In association with FIG. 2, one exemplary embodiment of a light-emitting semiconductor component described here is shown, in which a metallic mirror 101 is applied instead of the passivations 44, 54 and 6 or on said passivations, said metallic mirror being provided for reflecting light. A dielectric mirror 102 is applied to the underside of the semiconductor body 1c, said dielectric mirror being provided for selectively reflecting primary radiation B, for example blue light. The dielectric mirror 102, which is a DBR mirror, for example, is transmissive to the first secondary radiation G, for example green light, and the second secondary radiation R, for example red light. In the dielectric mirror 102, an opening 103 is provided for the primary radiation B to pass through, said opening completely penetrating through said dielectric mirror as far as the underside 1c of the semiconductor body 1.

Figure 3:
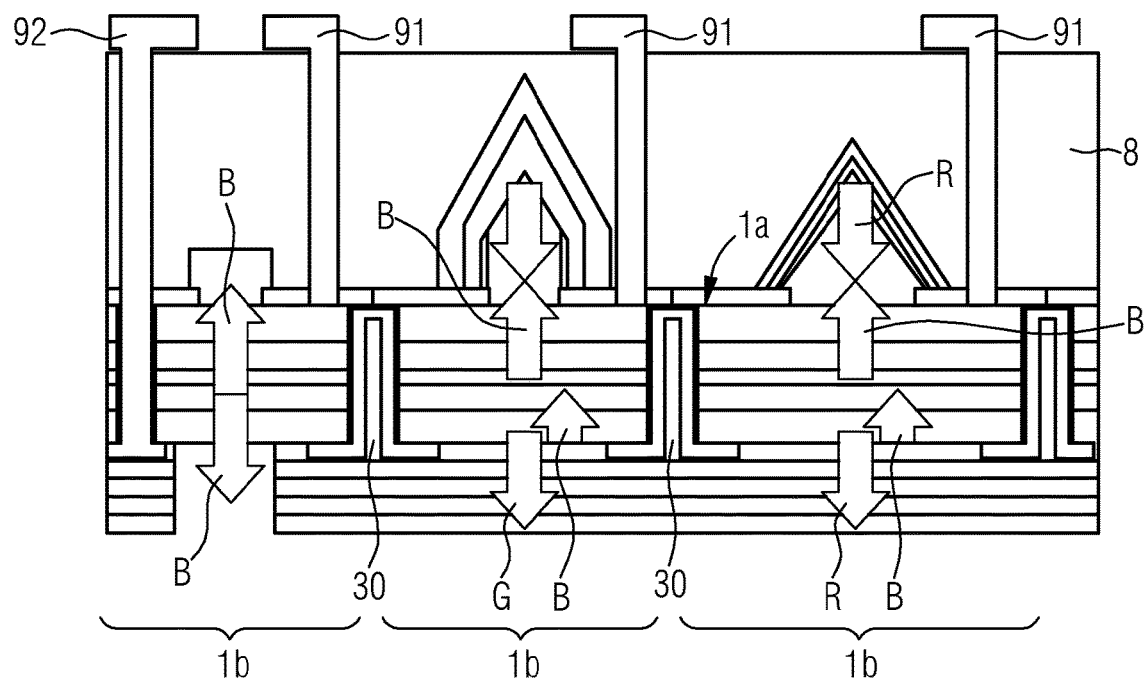

Possible contacting for the semiconductor component from FIG. is described in association with FIG. 3. In this case, connection elements 91 for p-side contacting and connection elements 92 for n-side contacting are provided, which completely penetrate through the planarization 8. The connection element 92 for n-side contacting in this case completely penetrates through the semiconductor body 1. In this exemplary embodiment, the light-emitting semiconductor component thus comprises individual p-type contacts and a common n-type contact formed by the connection element 92. The emission is effected through the underside of the semiconductor body 1c and, at the outer surface of the passivation 8 facing away from the top side 1a, the semiconductor component is provided for surface mounting on a carrier, for example an IC driver. The plated-through holes of the connection elements 91 serve for light shielding of the individual regions 1b of the semiconductor body, which are separated from one another by passivated trenches 30 and are thus operable independently of one another.

Figure 4:
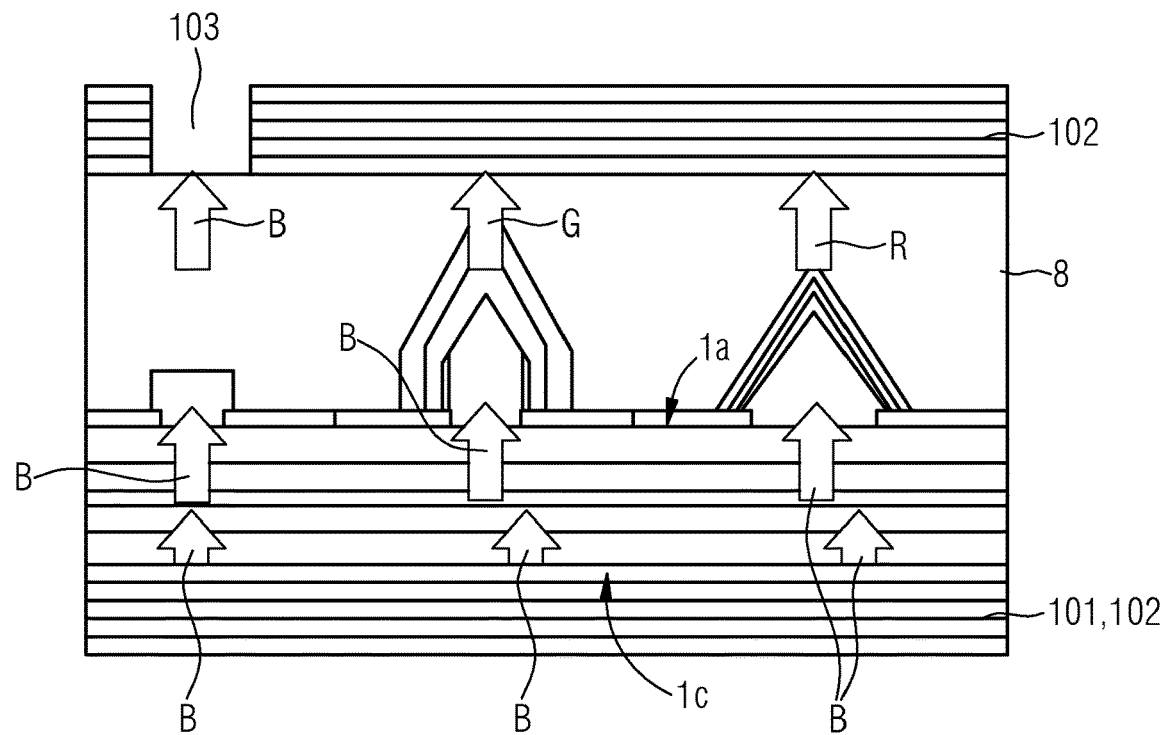

In association with FIG. 4, an exemplary embodiment is described in which, in contrast to the exemplary embodiment in FIG. 2, emission is effected from the top side 1a of the semiconductor body 1. For this purpose, a mirror is formed at the underside 1c of the semiconductor body, which mirror can be for example a metallic mirror 101 or a dielectric mirror 102. A dielectric mirror 102 is arranged at the side of the planarization 8 facing away from the top side of the semiconductor body 1a, said dielectric mirror being nontransmissive to the primary radiation B and transmitting the first secondary radiation G and the second secondary radiation R.

Figure 5:
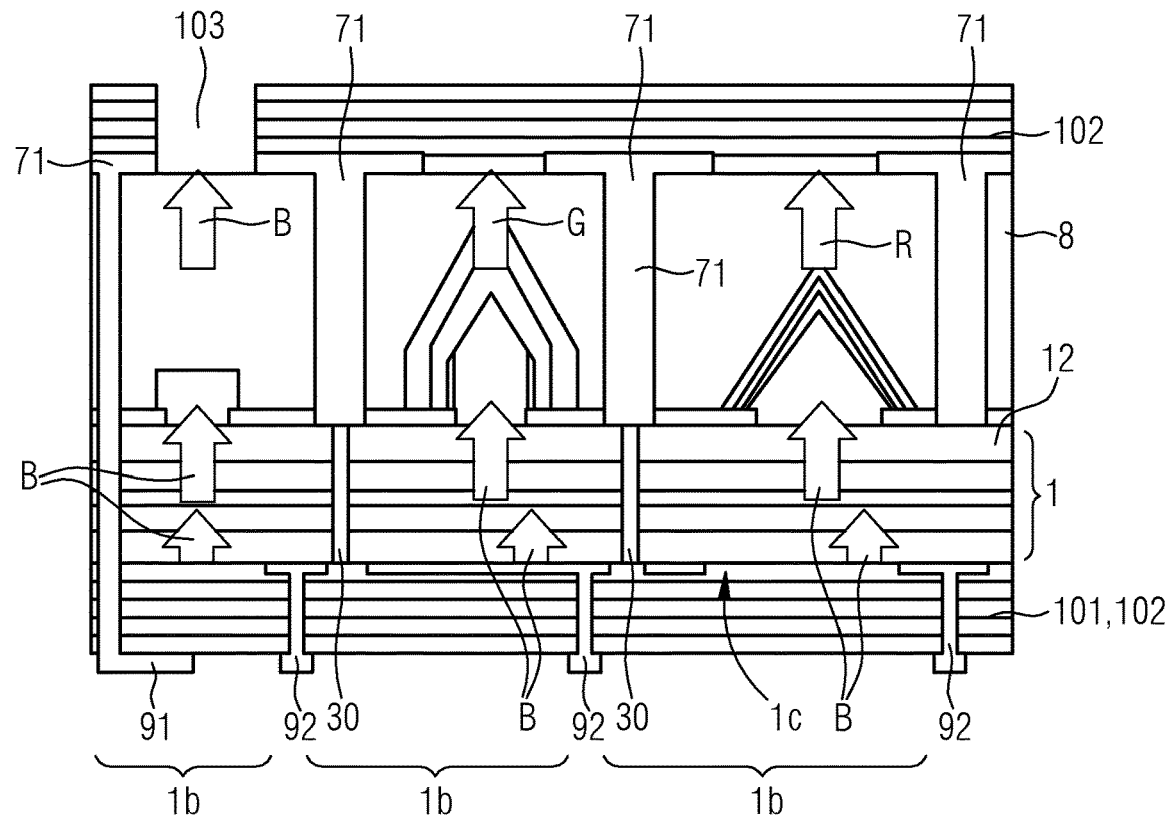

FIG. 5 shows a contacting possibility with regard to the exemplary embodiment in FIG. 4. Contact elements 71 for p-side contacting are provided there, which are electrically conductively connected to the p-side connection element 91. The contact elements 71 extend through the planarization 8. The connection elements 92 are provided for n-side contacting, said connection elements extending through the mirror 101, 102 at the underside 1c of the semiconductor body. By means of trenches 30 extending from the underside 1c of the semiconductor body right into the second doped region 12, the semiconductor body is subdivided into regions 1b which can be operated separately from one another. That is to say that, in this exemplary embodiment, the component comprises individual n-side connection elements 92 and a common p-side connection element 91. The component is surface-mountable and provided for example for connection, for example by bonding, on an IC driver. The plated-through holes of the contact elements 71 are for example configured as reflective and serve for light shielding of the individual regions 1b from one another. The contact elements 71 can be embodied in T-shaped fashion and thus, in addition to the dielectric mirror 102, prevent blue light from emerging.

In the exemplary embodiment in FIG. 6, provision is made of an optical separation 104 in the planarization 8, which can be configured as reflective or absorbent, for example. The semiconductor component comprises individual n-type contacts, the connection elements 92, and a common p-type contact formed by the connection element 91. The common p-type contact furthermore serves for good shielding of blue light in the region of the conversion elements 5, 6.

Figure 7A:
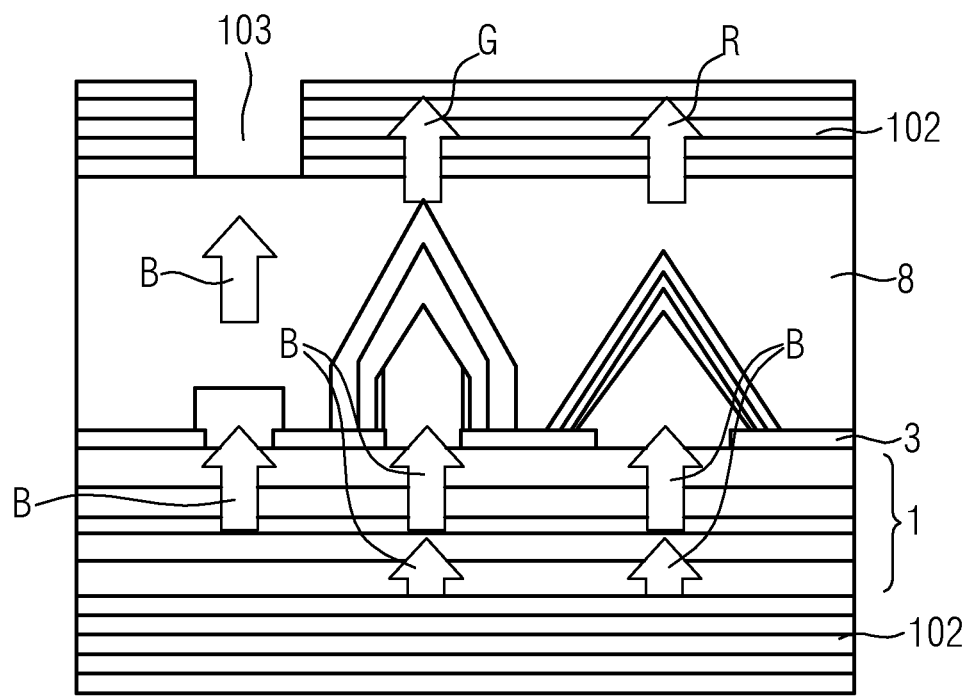
Figure 7B:
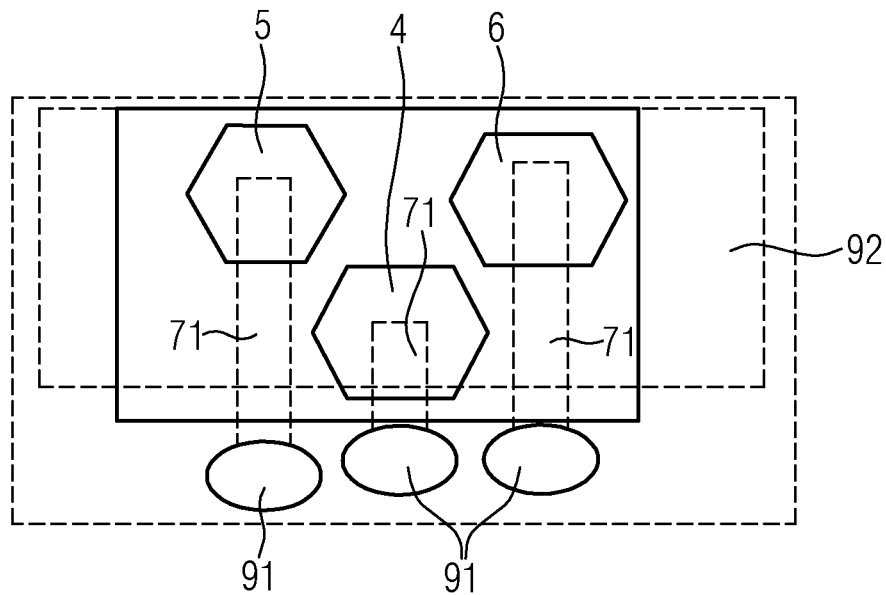

FIGS. 7A and 7B show one exemplary embodiment of a light-emitting component described here in the schematic sectional illustration and in the plan view of the underside of the component. It can be discerned there that, for example, a common contact can be provided by the connection element 92 and individual contacts can be provided by the connection elements 91.

Figure 8A:
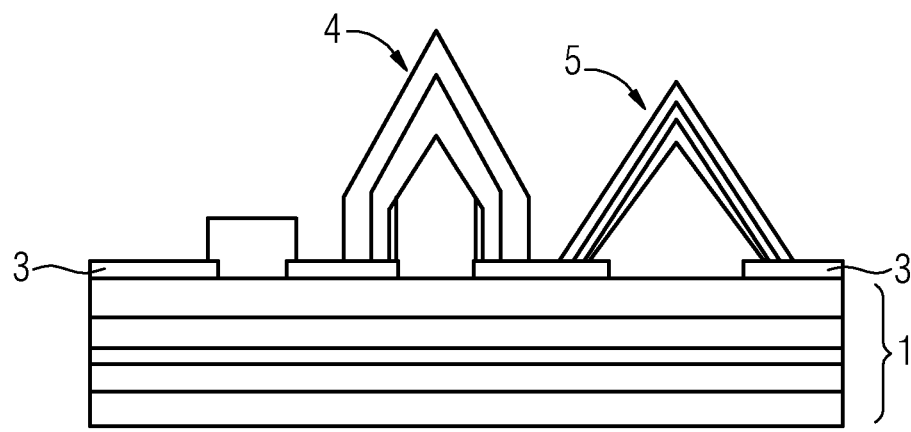
Figure 8B:
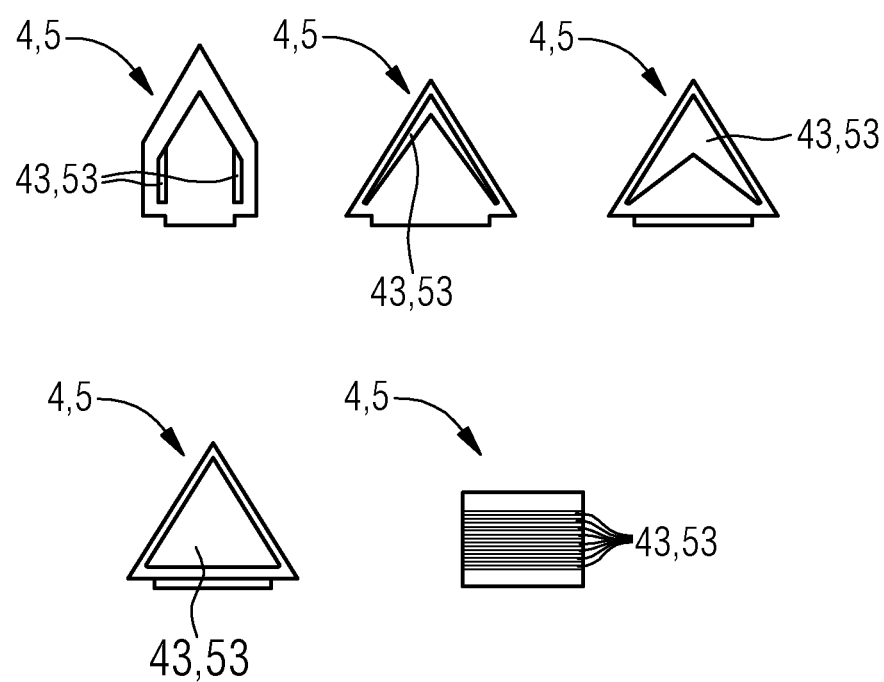

In association with FIGS. 8A and 8B, various shapes for the first conversion elements 2 and the second conversion elements are explained with reference to schematic sectional illustrations. The conversion elements can be core-shell rods, for example, which can be configured in cylindrical, pyramidal or parallelepipedal fashion. Furthermore, it is possible for the conversion elements to comprise active regions 43, 53 extending over the entire cross section of the conversion element.

In association with FIGS. 9A to 9F, a further exemplary embodiment of a method described here is explained in greater detail.

Figure 9A:
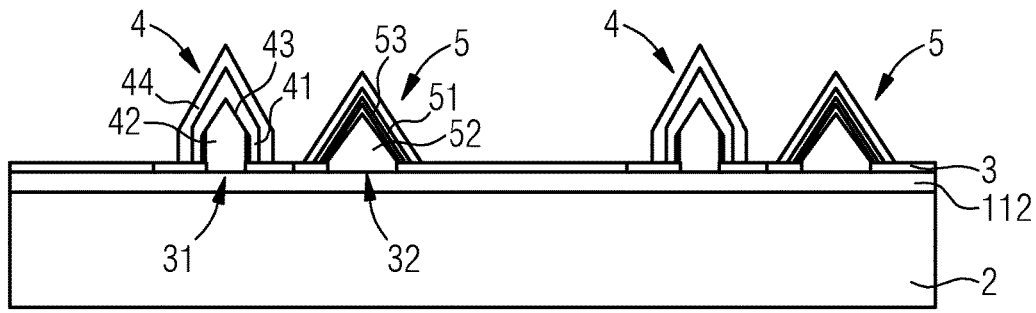

In the method, firstly, FIG. 9A, a multiplicity of conversion elements 4, 5 are provided. To that end, a growth substrate 2 is provided, which can be formed with sapphire, for example. A semiconductor layer 112 can be arranged at the top side of the growth substrate 2. The semiconductor layer 112 is for example a p-doped semiconductor layer, for example composed of p-GaN. The mask 3 is applied on the growth substrate 2 and, if present, on the semiconductor layer 112, the openings 31, 32 being produced in said mask as described above. The conversion elements 4, 5 are produced epitaxially in the openings in the manner described above. In this case, conversion elements such as are illustrated in FIG. 8B can be produced.

Figure 9B:
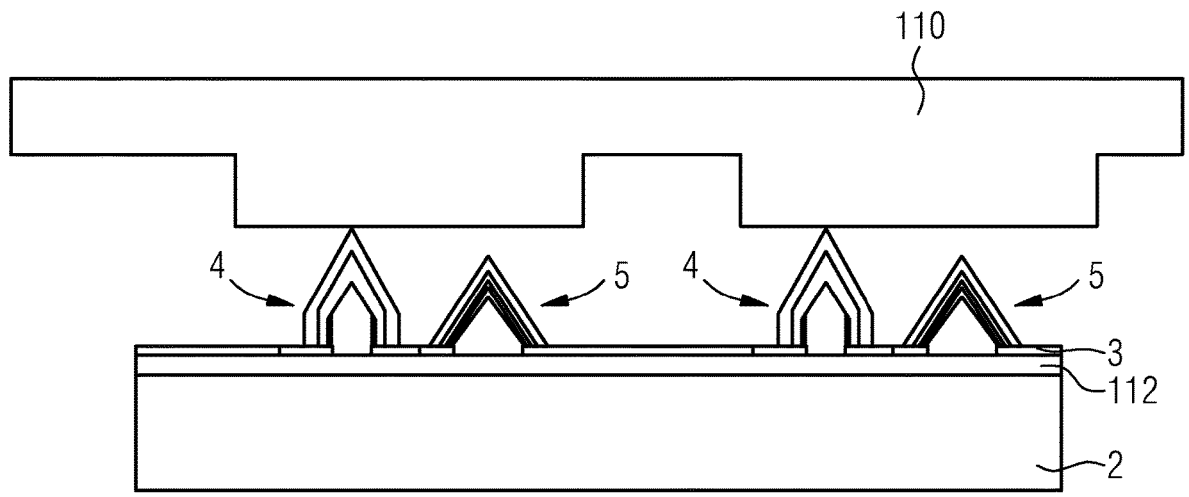
Figure 9C:
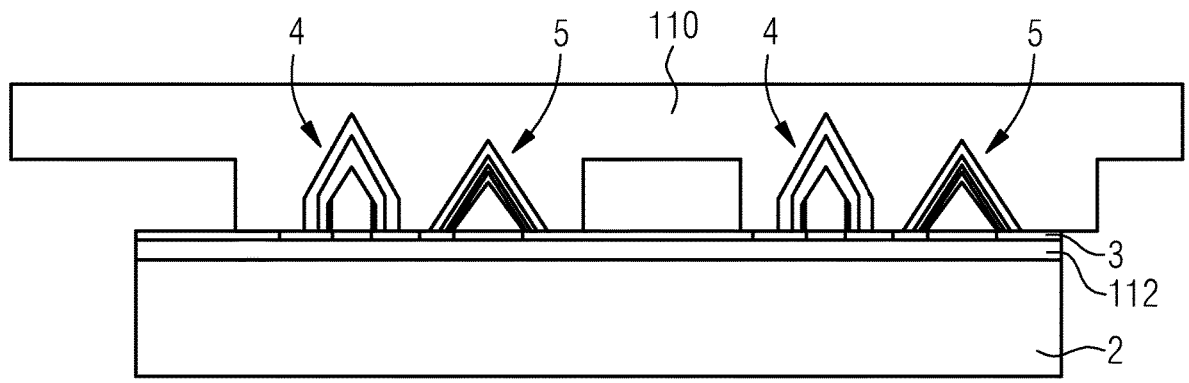
Figure 9D:
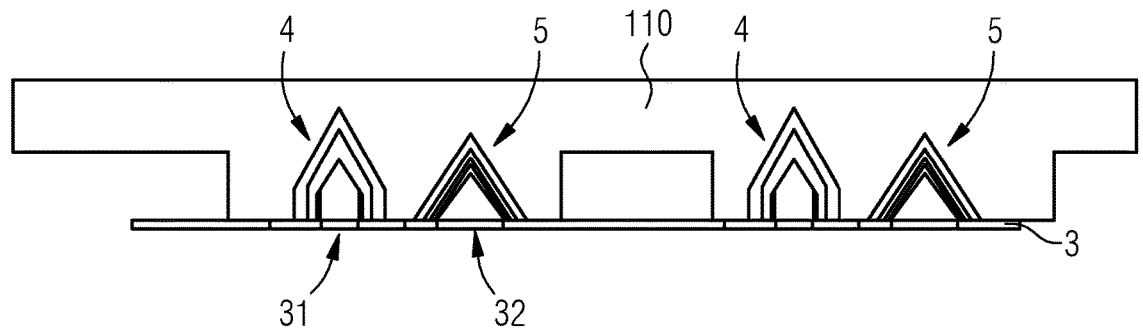

In the subsequent method step, FIG. 9B, a transfer process is effected by providing the matrix material 110, which completely surrounds the conversion elements 4, 5 at their exposed outer surfaces, FIG. 9C.

In this case, the matrix material 110 may already have been pre-cured for example during the embedding of the conversion elements 4, 5. In the method step described in association with FIG. 9D, the conversion elements are detached here together with the mask 3.

In association with FIG. 9E, the fact that the orientation of the conversion elements can subsequently be chosen freely is elucidated schematically. By way of example, the conversion elements 4, 5 can be secured to the semiconductor body 1 in such a way that they taper in the direction of the semiconductor body 1. The mask layer 3 can then be arranged at the side of the matrix material 110 facing away from the semiconductor body 1 and remain in the completed semiconductor component.

Figure 9E:
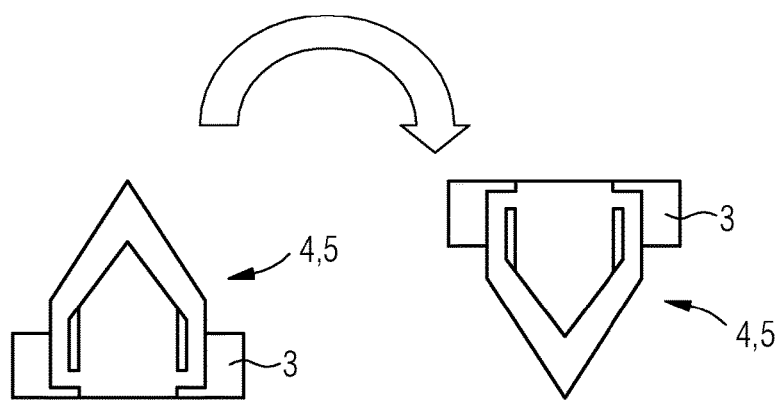
Figure 9F:
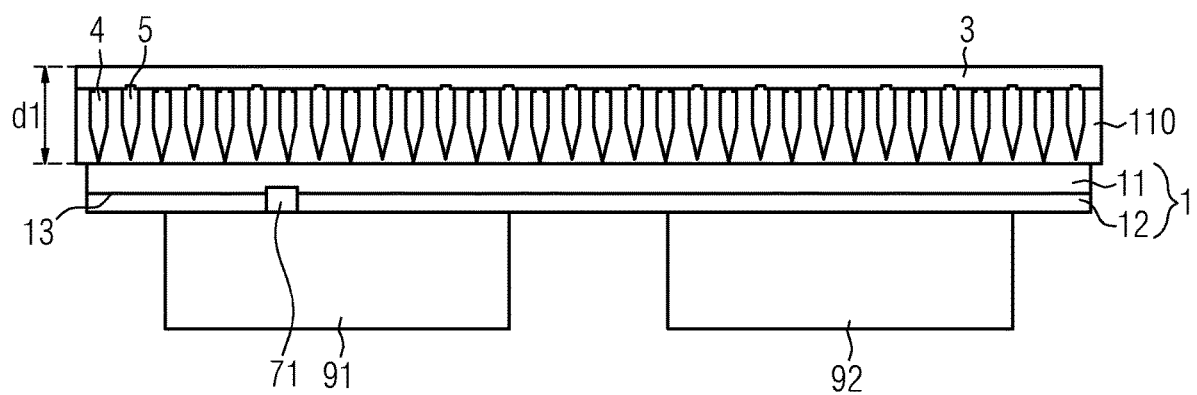

In this way, by way of example, a surface-mountable semiconductor component such as is illustrated in FIG. 9F is produced. That is to say that the semiconductor component is electrically connectable by way of the connection elements 91, 92 arranged at the bottom side of the component. For example, the n-side connection element 91 is electrically conductively connected to the first semiconductor region by a contact element 71 configured as a plated-through hole. The second connection element 92 is electrically conductively connected to the second doped region 12.

Besides the two orientations of the conversion elements 4, 5 as shown in FIG. 9E, other orientations during mounting onto the semiconductor body 1 are also conceivable. In this regard, it is possible, for example, for the main direction of extent of the conversion elements to run obliquely with respect to the main plane of extent of the semiconductor component.

The vertical extent d1 of the matrix material 110 can be chosen to be particularly small and can be a maximum of 1 µm, for example.

Figure 10:
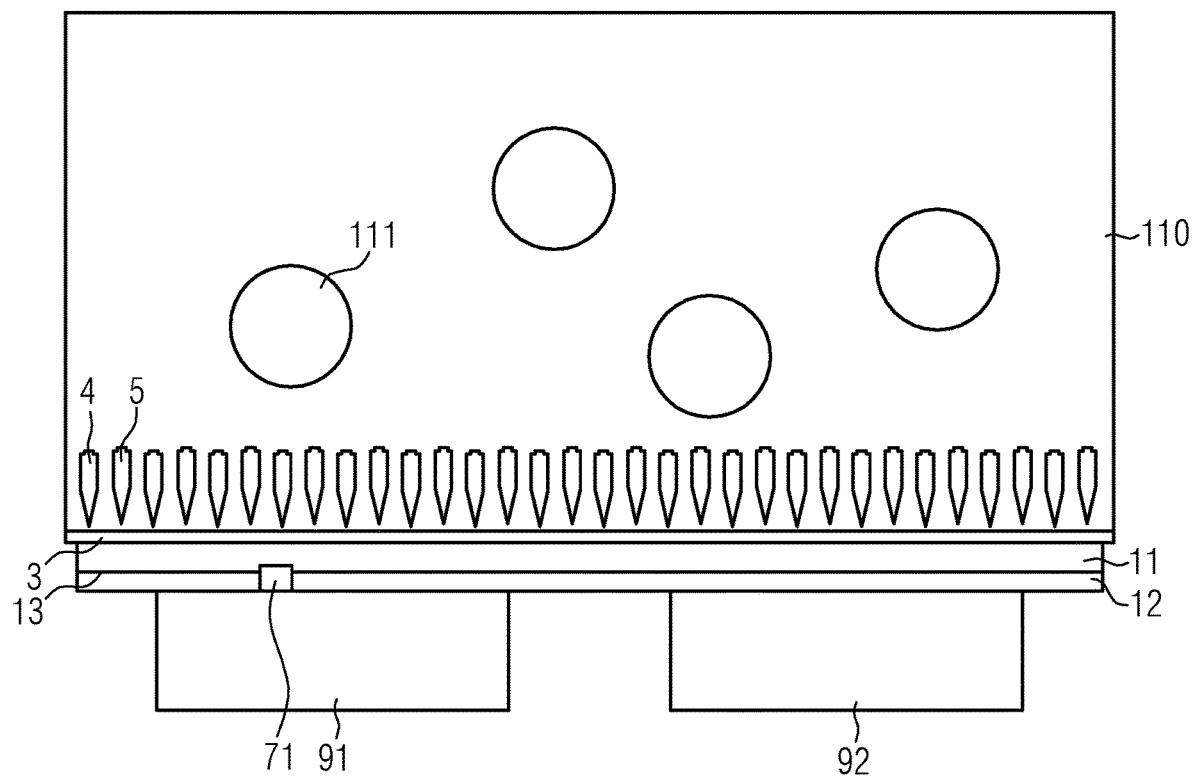

In association with the schematic illustration in FIG. 10, a further exemplary embodiment of a light-emitting semiconductor component described here is explained in greater detail. In contrast to the exemplary embodiment in FIG. 9F, the matrix material 110 is chosen to be thicker here and has for example a thickness d1 of 2 µm or more. Particles 111 are introduced into the matrix material 110, said particles being scattering particles and/or light-converting particles, for example.

Figure 11:
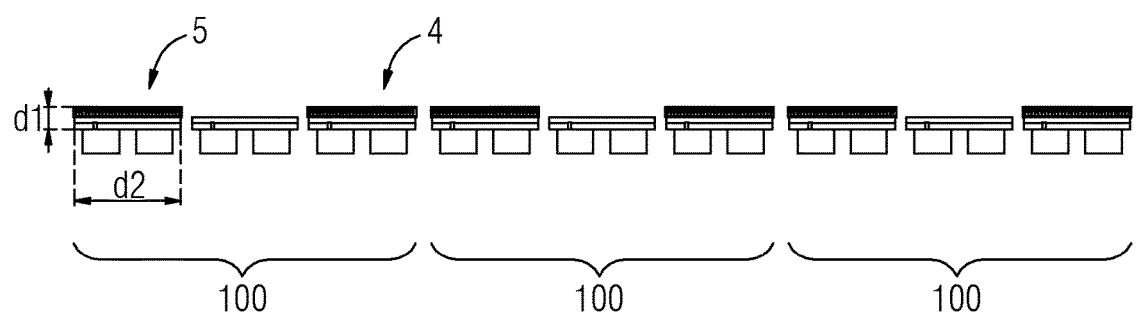

The schematic illustration in FIG. 11 shows a further exemplary embodiment of light-emitting semiconductor components described here. By way of example, in this exemplary embodiment, a multiplicity of the semiconductor components are arranged to form a display device, wherein in each case three of the semiconductor components form an RGB unit 100. To that end, in each RGB unit 100, use is made of a semiconductor component having a multiplicity of first conversion elements 4 for generating green light, a semiconductor component having a multiplicity of second conversion elements 5 for generating red light and a semiconductor component without a conversion element for generating blue light. The maximum lateral extent d2 of the semiconductor components here can be in each case 10 µm or less.

Figure 12:
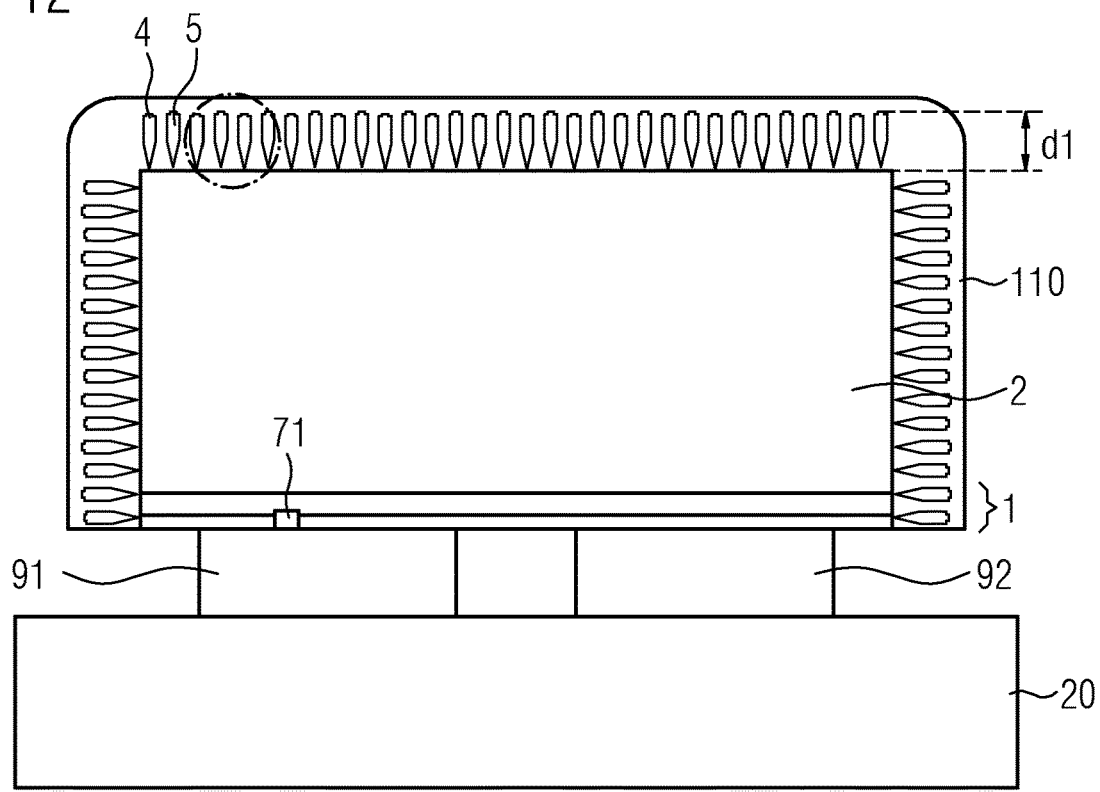

In association with FIG. 12, a further exemplary embodiment of a light-emitting semiconductor component described here is explained in greater detail. In this exemplary embodiment, the conversion elements 4, 5 are not applied directly on the semiconductor body 1, but rather on the growth substrate 2 remaining at the semiconductor body 1, which growth substrate can be formed with sapphire, for example. The semiconductor component in FIG. 12 is for example a sapphire flip-chip configured as a volume emitter. That is to say that at least 30% of the electromagnetic radiation emitted by the semiconductor component during operation emerges through side surfaces running transversely or perpendicularly with respect to the main plane of extent of the semiconductor component. As illustrated in FIG. 12, said side surfaces can also be covered with the conversion elements 4, 5 embedded into the matrix material 110. The coating of the side surfaces with the conversion elements 4, 5 is optional in this case. Here, too, the thickness of the matrix material 110, that is to say the vertical extent d1, can be a maximum of 1 µm.

Figure 13:
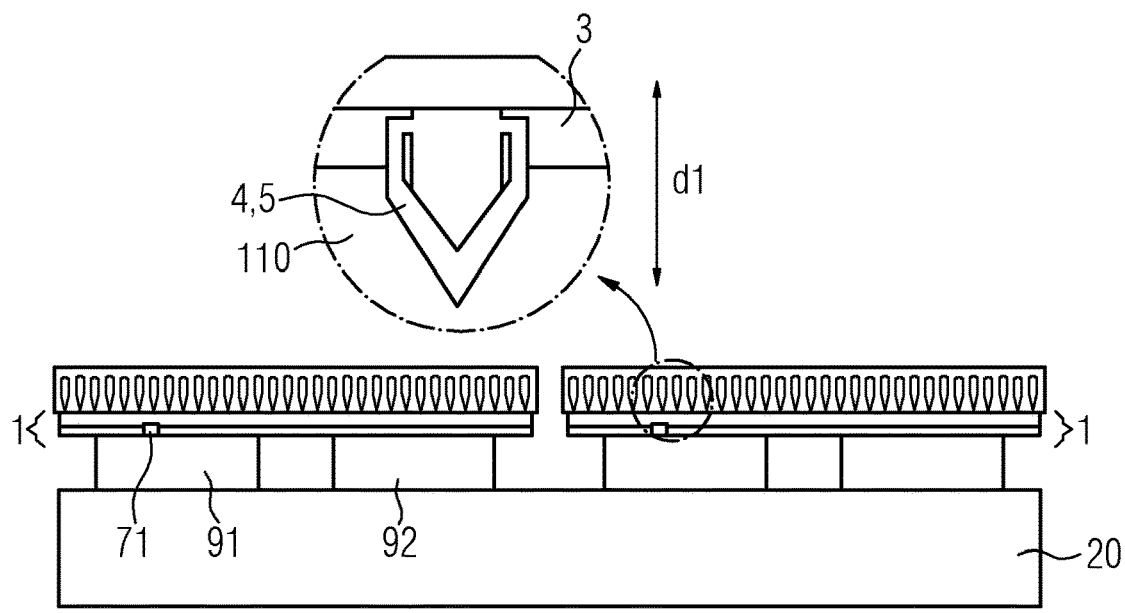

In the exemplary embodiment in FIG. 13, a light-emitting semiconductor component is illustrated in which a plurality of semiconductor bodies 1 connected in each case to the conversion elements 4, 5 are applied on a common carrier 20. The common carrier 20 is for example a connection carrier, such as a printed circuit board or a metal-core circuit board.

In association with FIG. 14, the relative emission intensity of conventional semiconductor components in curve a in comparison with semiconductor components described here in curve b is plotted against the operating temperature T. A reduced dependence on the operating temperature and an increased relative emission intensity at higher temperatures are manifested.

In FIG. 15, the internal quantum efficiency E is illustrated graphically in a comparison for a conventional semiconductor component—curve a—and semiconductor components described here—curves b, c. Here, too, an increased internal quantum efficiency at higher temperatures T is manifested.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priorities of German patent applications 102017129940.8 and 102018111021.9, the disclosure content of which is hereby incorporated by reference.

LIST OF REFERENCE SIGNS

1 Semiconductor body
1a Top side
1b Region
1c Underside
11 First doped region
12 Second doped region
13 Active region
2 Growth substrate
20 Carrier
21 Connecting layer
3 Mask
30 Trench
31 First opening
32 Second opening
33 Third opening
4 First conversion element
41 First doped region
42 Second doped region
43 Active region
44 Passivation
5 Second conversion element
51 First doped region
52 Second doped region
53 Active region
54 Passivation
6 Passivation
7 Contact element
71 Contact element
72 Contact element
8 Planarization
91 Connection element
92 Connection element
R Second secondary radiation, for example red light
G First secondary radiation, for example green light
B Primary radiation, for example blue light
100 RGB unit (pixel)
101 Metallic mirror
102 Dielectric mirror
103 Opening
104 Optical separation
110 Matrix material
111 Particle
112 Semiconductor layer
d1 Vertical extent
d2 Lateral extent

The invention claimed is:
1. A light-emitting semiconductor component comprising:
a semiconductor body comprising an active region configured to emit a primary radiation;
a first conversion element configured to convert part of the primary radiation to a first secondary radiation;
a second conversion element configured to at least partially convert the primary radiation to a second secondary radiation, wherein:
the first conversion element and the second conversion element are arranged at a top side of the semiconductor body;
the first conversion element and the second conversion element are configured as bodies that partly cover the semiconductor body at the top side thereof, and the first conversion element and the second conversion element are connected to the semiconductor body;
a dielectric mirror at at least the top side of the semiconductor body; wherein the dielectric mirror is configured to reflect the primary radiation and is transmissive to the first secondary radiation and the second secondary radiation, and wherein the dielectric mirror has at least one opening configured to transmit the primary radiation;
a planarization layer arranged between the semiconductor body and the dielectric mirror, wherein the planarization layer is arranged over the first conversion element and the second conversion element;
a mask arranged and on the semiconductor body, wherein the first conversion element and the second conversion element are arranged on the mask; wherein the mask has an opening in a region of each of the first conversion element and the second conversion element; and
one or more contact elements extending through the planarization layer and extending through a portion of the dielectric mirror.

2. The light-emitting semiconductor component as claimed in claim 1,
wherein the first conversion element and/or the second conversion element are/is monolithically connected to the semiconductor body.

3. The light-emitting semiconductor component as claimed in claim 1, wherein at least one of the first conversion element and the second conversion element is configured as a microrod or a nanorod; wherein the first conversion element is configured as the same or different as that of the second conversion element.

4. The light-emitting semiconductor component as claimed in claim 1, wherein at least one of the first conversion element and the second conversion element is produced epitaxially.

5. The light-emitting semiconductor component as claimed in claim 1, wherein at least one of the first conversion element and the second conversion element has a maximum lateral extent that is small relative to the maximum lateral extent of the semiconductor body.

6. The light-emitting semiconductor component as claimed in claim 1, wherein the semiconductor body is structured into a plurality of regions which are operable independently of one another, wherein each of the first conversion element and the second
conversion element is assigned to a respective one of the regions.

7. The light-emitting semiconductor component as claimed in claim 1, which is configured to emit blue light as the primary radiation, green light as the first secondary radiation, and red light as the second secondary radiation.

8. The light-emitting semiconductor component as claimed in claim 1, wherein at least a portion of the dielectric mirror is arranged directly on at least one contact element of the one or more contact elements.

9. A method for producing a light-emitting semiconductor component comprising:
a semiconductor body comprising an active region configured to emit a primary radiation;
a first conversion element configured to convert part of the primary radiation to a first secondary radiation;
a second conversion element configured to at least partially convert the primary radiation to a second secondary radiation, wherein:
the first conversion element and the second conversion element are arranged at a top side of the semiconductor body;
the first conversion element and the second conversion element are configured as bodies that partly cover the semiconductor body at the top side thereof, and
the first conversion element and the second conversion element are connected to the semiconductor body;
a dielectric mirror at at least the top side of the semiconductor body; wherein the dielectric mirror is configured to reflect the primary radiation and is transmissive to the first secondary radiation and the second secondary radiation, and wherein the dielectric mirror has at least one opening configured to transmit the primary radiation;
a planarization layer arranged between the semiconductor body and the dielectric mirror, wherein the planarization layer is arranged over the first conversion element and the second conversion element;
a mask arranged and on the semiconductor body, wherein the first conversion element and the second conversion element are arranged on the mask; wherein the mask has an opening in a region of each of the first conversion element and the second conversion element; and
one or more contact elements extending through the planarization layer and extending through a portion of the dielectric mirror;
wherein the method comprises:
providing the semiconductor body;
producing the mask having the openings at the top side of the semiconductor body;
epitaxially producing the first conversion element and the second conversion element at the top side of the semiconductor body in the openings of the mask.

* * * * *